(12) United States Patent
Takeda et al.

(10) Patent No.: US 8,048,735 B2
(45) Date of Patent: Nov. 1, 2011

(54) MANUFACTURING METHOD OF SEMICONDUCTOR DEVICE

(75) Inventors: Kenichi Takeda, Tokorozawa (JP);
 Tsuyoshi Fujiwara, Hamura (JP);
 Toshinori Imai, Ome (JP)

(73) Assignee: Hitachi, Ltd., Tokyo (JP)

( * ) Notice: Subject to any disclaimer, the term of this patent is extended or adjusted under 35 U.S.C. 154(b) by 1173 days.

(21) Appl. No.: 11/764,073

(22) Filed: Jun. 15, 2007

(65) Prior Publication Data
 US 2008/0020540 A1    Jan. 24, 2008

(30) Foreign Application Priority Data
 Jun. 29, 2006   (JP) ................. 2006- 179027

(51) Int. Cl.
 *H01L 21/8242*    (2006.01)
(52) U.S. Cl. ........ 438/240; 438/238; 438/381; 438/680; 438/706; 257/E21.006; 257/E21.027; 257/E21.029; 257/E21.17; 257/E21.229; 257/E21.267; 257/E21.645; 257/E21.646
(58) Field of Classification Search ................. 438/240, 438/238, 381, 637, 680, 700, 706, 722, 723, 438/724; 257/E21.006, E21.027, E21.17, 257/E21.029, E21.267, E21.645, E21.646
See application file for complete search history.

(56) References Cited

U.S. PATENT DOCUMENTS

| 7,586,143 | B2 * | 9/2009 | Watanabe | 257/303 |
| 2004/0079980 | A1 | 4/2004 | Hieda | |
| 2004/0135186 | A1 * | 7/2004 | Yamamoto | 257/296 |

FOREIGN PATENT DOCUMENTS

| JP | 2004-152796 A | 5/2004 |
| JP | 2004-214304 A | 7/2004 |

* cited by examiner

*Primary Examiner* — David Nhu
(74) *Attorney, Agent, or Firm* — Miles & Stockbridge P.C.

(57) ABSTRACT

The present invention provides an MIM capacitor using a high-k dielectric film preventing degradation of breakdown field strength of the MIM capacitor and suppressing the increase of the leakage current. The MIM capacitor comprises a first metal interconnect, a fabricated capacitance film, a fabricated upper electrode, and a third metal interconnect. The MIM capacitor is realized by forming an interlayer dielectric film comprising silicon oxide so as to cover the first metal interconnect, then forming a first opening in the interlayer dielectric film to a region corresponding to a via hole layer in the interlayer dielectric film just above the first metal interconnect so as not to expose the upper surface of the first metal interconnect, then forming a second opening to the inside of the first opening so as to expose the surface of the first metal interconnect and then forming a capacitance film and a third metal interconnect.

9 Claims, 22 Drawing Sheets

MIM CAPACITOR REGION | INTERCONNECT REGION

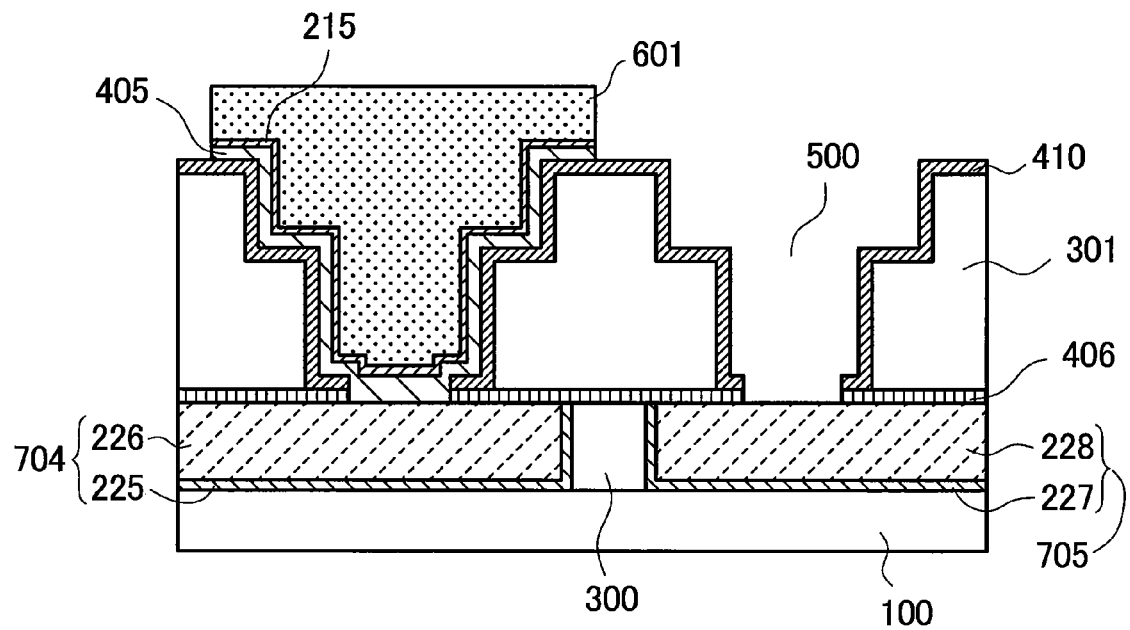
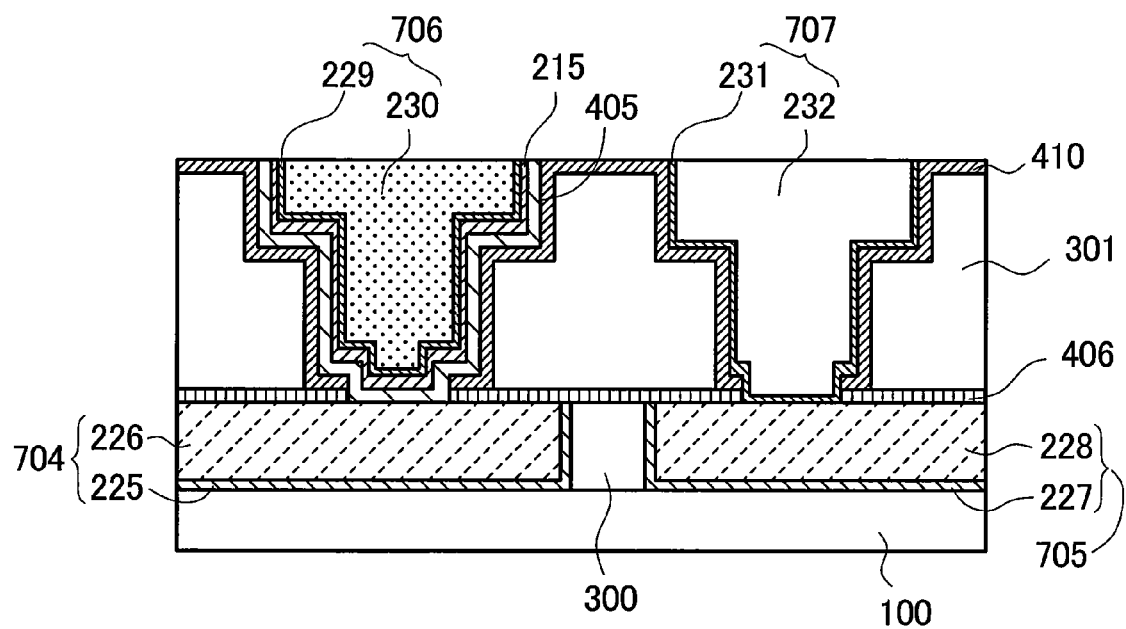

MANUFACTURING METHOD OF
SEMICONDUCTOR DEVICE

CLAIM OF PRIORITY

The present application claims priority from Japanese application JP 2006-179027, filed on Jun. 29, 2006, the content of which is hereby incorporated by reference into this application.

BACKGROUND OF THE INVENTION

1. Field of the Invention

The present invention relates to a method of manufacturing a semiconductor device having a high performance capacitor.

2. Description of the Related Art

In ICs (Integrated circuits) handling analog signals, passive devices such as capacitance elements, resistance elements, and inductance elements are important constituent elements for integrated circuits. Since it has been difficult to build in such passive devices in IC chips, the passive devices have been mounted as external parts on mounting boards. However, in view of requirement for increase in the operation speed and space saving of systems in recent years, attempts for incorporating such passive devices to the inside of IC chips have been made vigorously.

An MIM (Metal-Insulator-Metal) capacitor of sandwiching a dielectric film between metal electrodes has recently attracted attention as a method of forming a capacitor in the IC chip. This has a feature suitable for the use for high frequency operation due to less coupling resistance since the upper and lower electrodes can be formed with metal interconnects of low sheet resistance and low coupling resistance since it can be formed in a multilevel interconnect layer. However, since silicon oxide having a specific dielectric constant of 3.9 or silicon nitride having a specific dielectric constant of 7.0 has been mainly used so far as a capacitance dielectric film, a large area is necessary in a case of forming a capacitor of large capacitance to result in a problem of increasing the chip area and increasing the chip cost. As a method capable of overcoming the problem, MIM capacitors using a high-k film (dielectric film of high dielectric constant) have been noted in recent years.

The feature and the problem of the MIM capacitor using the high-k film are to be described with reference to an existent example described in JP-A-2004-214304 (Patent Document 1) shown in FIG. 2.

As shown in FIG. 2, after forming a first interlayer dielectric film 300 comprising silicon oxide from tetraethoxy silane as the starting material by using a plasma CVD method on a substrate in which a semiconductor device is formed, an opening is formed to the first interlayer dielectric film 300, and the opening was filled with a conductive plug 250 comprising tungsten. Then, after forming a second interlayer dielectric film 301 comprising silicon oxide of 1 µm thickness from tetraethoxy silane as a starting material by using a plasma CVD method, an opening was formed to a desired region to expose the conductive plug 250. Then, after forming titanium nitride of 50 nm film thickness, a lower electrode 200 comprising titanium nitride was left only in the region inside the opening formed in the second interlayer dielectric film 301 by using a lithographic method, and a dry etching method. Then, after forming a first capacitance film 400 comprising an HfAlO film (hafnium oxide film containing aluminum) of 20 nm thickness by using an ALD method (Atomic layer Deposition method), a titanium nitride film of 50 nm thickness was formed, and an upper electrode 201 was formed so as to cover the opening formed in the second interlayer dielectric film 301 by a lithographic method and a dry etching method. By the steps described above, an MIM capacitor comprising the lower electrode 200, the first capacitance film 400, and the upper electrode 201 can be formed. The MIM capacitor formed according to the steps described above is to be referred to as Existent Example 1 (refer to Patent Document 1).

In the MIM capacitor according to Conventional Example 1, since the HfAlO film having a specific dielectric constant of about 20 is used as a capacitance film, a capacitor of a large capacitance can be formed in a small area and the problem involved in the MIM capacitor using silicon oxide or silicon nitride as the capacitance film can be overcome.

However, the MIM capacitor constituted as described above has a drawback that a small capacitance cannot be formed easily at a high accuracy.

As a method of overcoming the problem, it has been proposed a method of using a capacitance film of low capacitance density for a capacitor requiring accuracy for the capacitance. Since the variation of the capacitance caused by the fabrication fluctuation can be restricted in a case where the capacitance density is low, even a capacitor of a small size can be formed at a high accuracy with less variation. An existent example of a step of forming such an MIM capacitor is to be described with reference to FIG. 3 (JP-A-2004-152796 (Patent Document 2)).

As shown in FIG. 3, after forming a first interlayer dielectric film 300 by using a plasma CVD method from tetraethoxy silane as a starting material on a substrate formed with a semiconductor device, and after forming titanium nitride of 50 nm film thickness and silicon nitride of 20 nm film thickness, a first fabricated capacitance film 401 comprising silicon nitride of 20 nm film thickness was formed only to a desired region by using a lithographic method and a dry etching method. Then, after forming HfAlO of 20 nm film thickness and titanium nitride of 50 nm film thickness successively, a first lower electrode 202 and a second lower electrode 203 comprising titanium nitride, a first fabricated capacitance film 401 comprising silicon nitride, a second fabricated capacitance film 402 and a third fabricated capacitance film 403 comprising HfAlO, and a first upper electrode 204 and a second upper electrode 205 comprising titanium nitride were formed by the combination of a lithographic method and a dry etching method. Then, after forming a second interlayer dielectric film 301 comprising silicon oxide of 1 µm thickness by using a plasma CVD method and after planarizing the same by a chemical-mechanical polishing method and after forming openings in the second interlayer electric film 301 so as to expose the first upper electrode 204 and the second upper electrode 205, a tungsten film was formed so as to fill the openings by using a sputtering method and a CVD method, and the tungsten film in the region other than the openings was removed by using chemical-mechanical polishing to form a first conductive plug 251 and a second conductor plug 252. Then, an aluminum film of 500 nm thickness was formed by a sputtering method and a metal interconnect 206 connected with the first conductive plug and a metal interconnect 207 connected with the second conductive plug were formed by using a lithographic method and a dry etching method. By the steps described above, a semiconductor device having an MIM capacitor comprising the first lower electrode 202, the first fabricated capacitance film 401, the fabricated third capacitance film 403, and the first upper electrode 204 (referred to as type A) and an MIM capacitor comprising the second lower electrode 203, the second fabricated capacitance film 402, and the second upper electrode 205 (referred to as type B) can be formed. The MIN capacitor formed in accordance with the steps described above is referred to as Conventional Example 2 (refer to Patent Document 2)

The MIM capacitor according to Conventional Example 2 is identical with Conventional Example 1 in that the fabrication fluctuation for the upper electrode or the lower electrode results in the variation of capacitance. However, according to Conventional Example 2, since capacitors of different capacitance densities can be formed simultaneously, high capacitance density and high capacitance accuracy can be satisfied together by using a capacitor of high capacitance density for the capacitor of large capacitance (type B capacitor) and using a capacitor of high capacitance accuracy (type A capacitor) in a case of intending to suppress the capacitance variation with a small area.

SUMMARY OF THE INVENTION

As described above, the MIM capacitor constituted with the method of Conventional Example 1 involves the drawback that a small capacitance cannot be formed easily at a high accuracy. In the case of using the method described above, since the capacitance density (capacitance value per unit area) increases several times as high as that of the existent case, the capacitance variation caused by the variation of the shape of the opening formed in the second interlayer dielectric film 301 reaches several times as much as the variation compared with the existent case to provide a problem that it is difficult to form a capacitor of a small capacitance, that is, small size at a high accuracy.

Further, MIM capacitor formed by the method of Conventional Example 2 involves a problem of lowering of the reliability such as lowering of the breakdown field strength or increase of the leakage current since the capacitance film formed at first undergoes the dry etching or ashing plasmas. That is, according to the method, lithography, dry etching and resist ashing have to be applied in a state where the surface of the capacitance film is exposed in order to leave the capacitance film only in the desired region, which leads to the problem of lowering the reliability.

Then, the present invention intends to provide a technique of improving the reliability upon forming an MIM capacitor capable of making high capacitance density and high capacitance accuracy compatible.

The foregoing subject can be attained upon forming an interlayer dielectric film so as to cover a lower layer interconnect, forming an opening in a region corresponding to a via hole of the interlayer dielectric film, and forming a capacitance film and an upper layer interconnect so as to cover the opening thereby forming an MIM capacitor, by conducting lithography by at least twice in the step of forming the opening.

The subject can be attained, upon forming an opening in a region corresponding to the via hole layer of the interlayer dielectric film above the lower layer interconnect, by forming a first opening so as not to expose the surface of the lower layer interconnect, then forming a second opening in the first opening so as to expose the surface of the lower layer interconnect and then forming a capacitance film and an upper layer interconnect.

The subject can be attained by forming an etch stop layer having an opening above the lower layer interconnect, forming an interlayer dielectric film, forming an opening to the via hole layer of the interlayer dielectric film so as to include the opening disposed to the etch stop layer, thereby exposing the surface of the lower layer interconnect through the opening, and then forming a capacitance film and an upper layer interconnect.

The subject can be attained by forming an opening in a region corresponding to the via hole layer of the interlayer dielectric film above the lower layer interconnect to expose the surface of the lower layer interconnect, forming a spacer film on the exposed surface of the lower layer interconnect, forming an opening to a spacer film inside of the opening formed to the interlayer dielectric film to expose the surface of the lower layer interconnect and then forming a capacitance film and an upper layer interconnect.

According to the invention, it is possible to keep the capacitance accuracy of a small area capacitor high even in a case of applying a capacitance film at high capacitance density for the formation of the MIM capacitor. Further, it is possible to obtain a semiconductor device having an MIM capacitor with high reliability and capable of reducing the IC chip size since lowering of the reliability such as deterioration of breakdown field strength or increase in the leakage current can be suppressed.

BRIEF DESCRIPTION OF THE DRAWINGS

FIG. 23A is a cross sectional schematic view for a main portion of a manufacturing step of a semiconductor device according to the eighth embodiment of the present invention; and FIG. 23B is a cross sectional schematic view for a main portion of a manufacturing step of a semiconductor device according to the eighth embodiment of the present invention;

DETAILED DESCRIPTION OF THE PREFERRED EMBODIMENTS

The present invention is to be described by way of preferred embodiments with reference to the drawings. Each of the drawings is schematically drawn and those portions not necessary for descriptions are to be omitted.

First Embodiment

FIG. 4 and FIG. 5 are cross sectional views showing manufacturing steps of a semiconductor device according to a first embodiment of the present invention. Description is to be made successively.

Figure 4A:
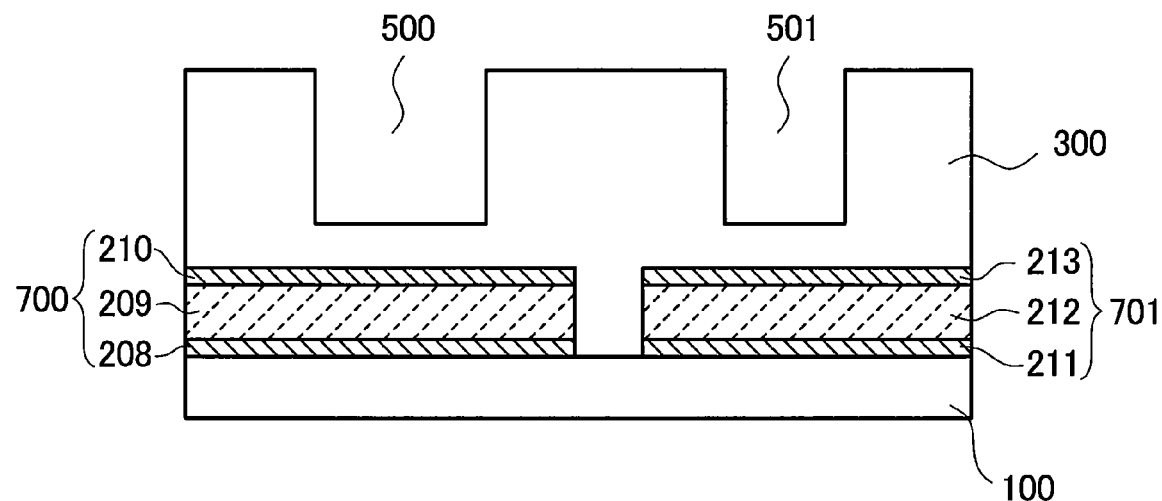
FIG. 4A is a cross sectional schematic view for a main portion of a manufacturing step of a semiconductor device according to the first embodiment of the present invention.

After forming titanium nitride of 50 nm film thickness, aluminum of 400 nm film thickness, and titanium nitride of 50 nm film thickness by using a sputtering method on a substrate 100 formed with a semiconductor device, a first metal interconnect 700 comprising a first barrier metal 208, a first aluminum layer 209 and a second barrier metal layer 210, and a second metal interconnect 701 comprising a third barrier metal 211, a second aluminum layer 212, and a fourth barrier metal layer 213 were formed by using a lithographic method and a dry etching method. Then, a silicon oxide film of 2 µm thickness was formed by using a plasma CVD method as a first interlayer dielectric film 300. Then, after improving the planarity of the first interlayer dielectric film by using a chemical-mechanical polishing method, openings were formed in the first interlayer dielectric film 300 at least in a region where the MIM capacitor is to be formed by using a lithographic method and a dry etching method. In this case, the planar shape for each of the first opening 500 and the second opening 501 formed in the first interlayer dielectric film 300 was a square shape of 1.2 µm side length, the depth of the opening was 1 µm, and the thickness of silicon oxide remained between the upper surface of the first metal interconnect 700 or the second metal interconnect 701 and the bottom for each of the openings was defined as 100 nm (FIG. 4A).

Figure 4B:
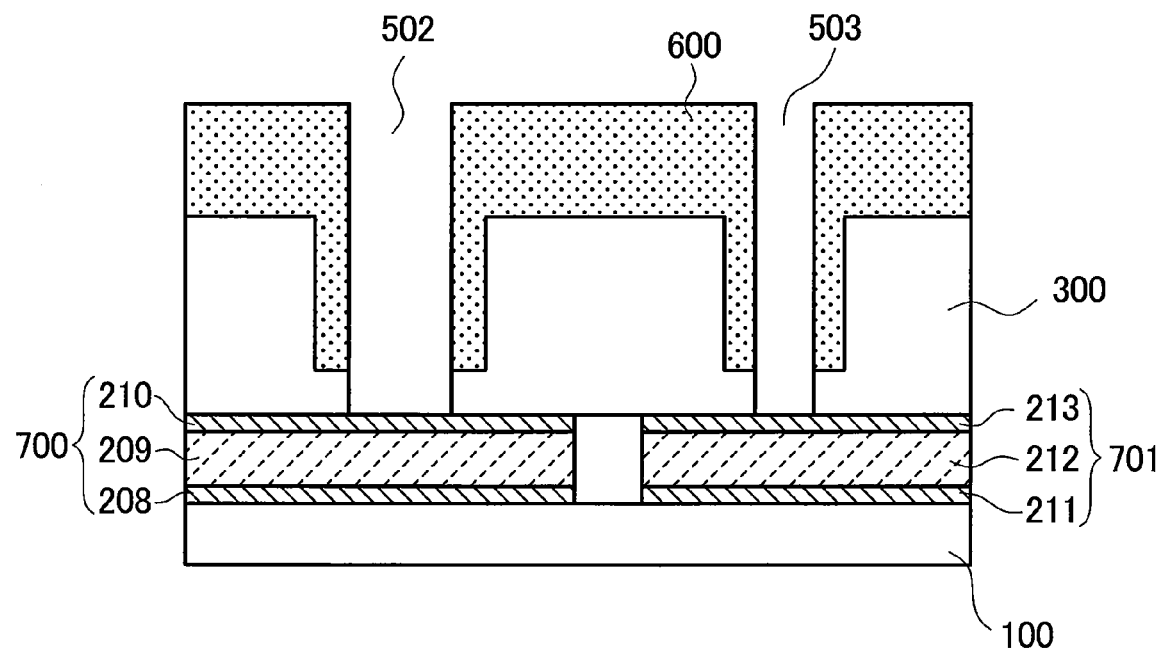
FIG. 4B is a cross sectional schematic view for a main portion of a manufacturing step of a semiconductor device according to the first embodiment of the present invention.

Then, a first fabrication resist 600 comprising a photosensitive organic polymer film having openings in the first opening 500 and the second opening 501 was formed by using a lithographic method. Then, the first interlayer dielectric film 300 was fabricated by using a dry etching method to expose the upper surface of the first metal interconnect 700 and the second metal interconnect 701, thereby forming a third opening 502 formed inside the first opening 500 and a fourth opening 503 formed inside the second opening 501. The third opening 502 has a square planar shape of 1 µm side length and is formed in such as shape as completely included inside the first opening 500. In this case, since the side length of the first opening 500 is longer than the side length of the third opening 502, a step is formed in the first interlayer dielectric film 300 near the bottom of the first opening 500. The height of the step inside the first opening 500 formed in this step is referred to as a height of the step. Since the difference of the height between the upper surface of the first metal interconnect 700 and the first opening 500 is 100 nm, the height of the step in this embodiment is 100 nm (FIG. 4B).

Figure 5A:
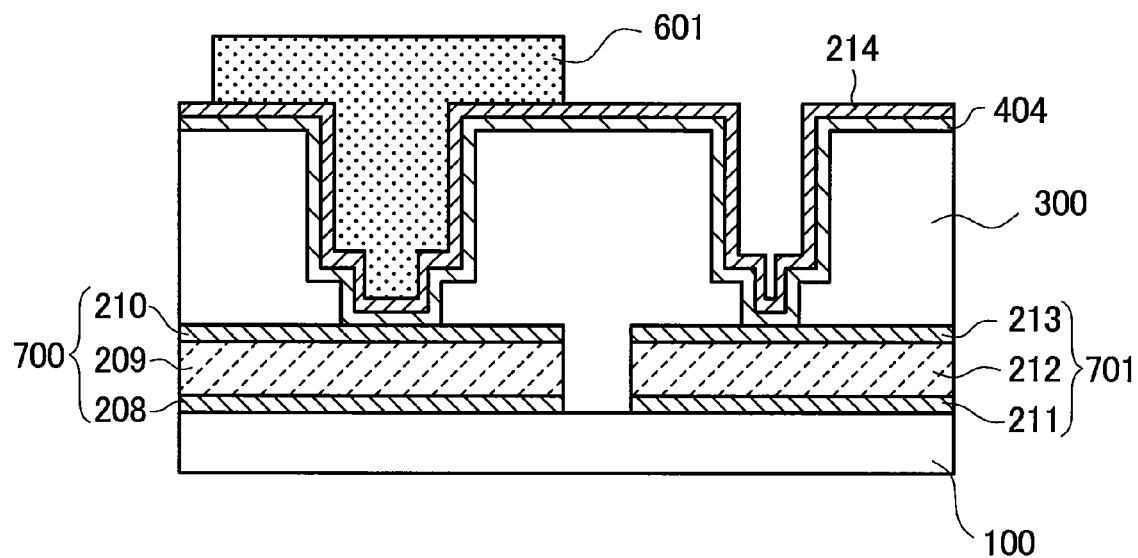
FIG. 5A is a cross sectional schematic view for a main portion of a manufacturing step of a semiconductor device according to the first embodiment of the present invention.

Then, as shown in FIG. 5A, after removing the first fabrication resist 600, a capacitance film 404 comprising hafnium oxide of 15 nm thickness formed by an ALD method, and an upper electrode film 214 comprising titanium nitride of 50 nm thickness formed by a CVD method were formed successively. Then, a second fabrication resist 601 comprising a photosensitive organic polymer film was formed so as to cover a region intended to serve as a capacitor by using a lithographic method.

Figure 5B:
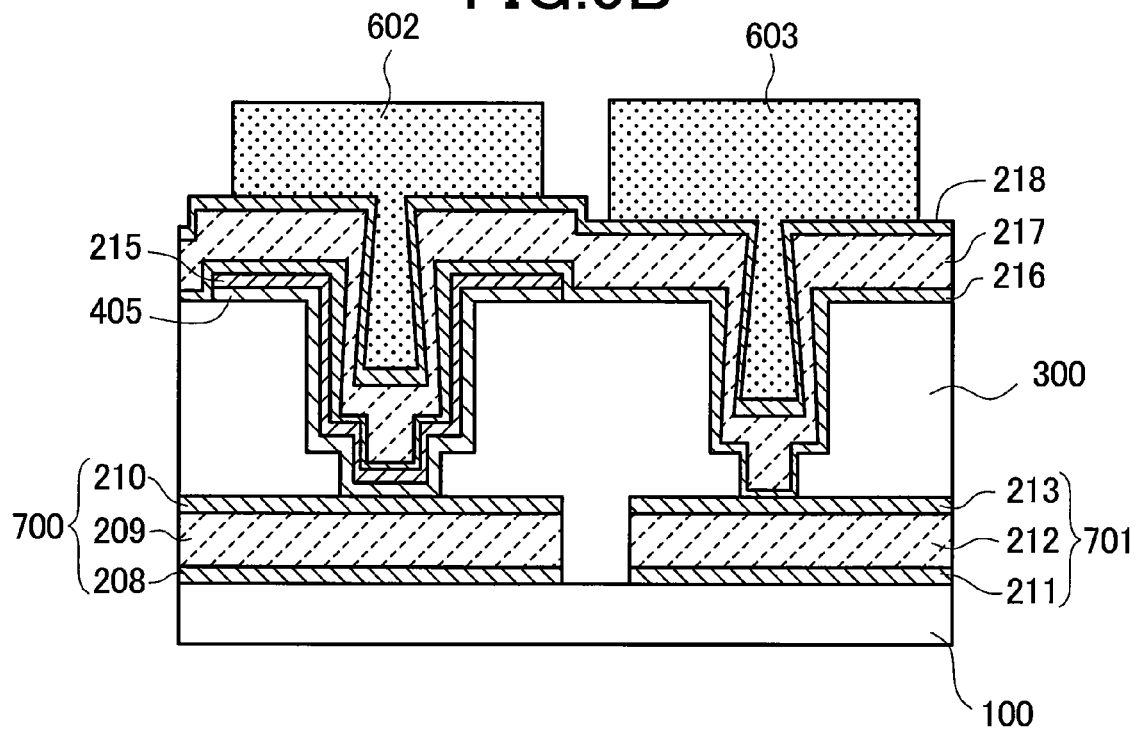
FIG. 5B is a cross sectional schematic view for a main portion of a manufacturing step of a semiconductor device according to the first embodiment of the present invention.

Then, after removing an unnecessary portion of the upper electrode film 214 and the capacitance film 404 by using the second fabrication resist 601 as an etching mask and forming a fabricated upper electrode 215 and a fabricated capacitance film 405, the second fabrication resist 601 was removed. Then, a first barrier metal film 216 comprising titanium nitride of 50 nm film thickness, a first aluminum film 217 comprising aluminum of 400 nm thickness, and a second barrier metal film 218 comprising titanium nitride of 50 nm thickness were formed by using a sputtering method, and a third fabrication resist 602 and a fourth fabrication resist 603 comprising a photosensitive organic polymer film were formed so as to cover a portion intended to be left as interconnects by using a lithographic method (FIG. 5B).

Figure 1:
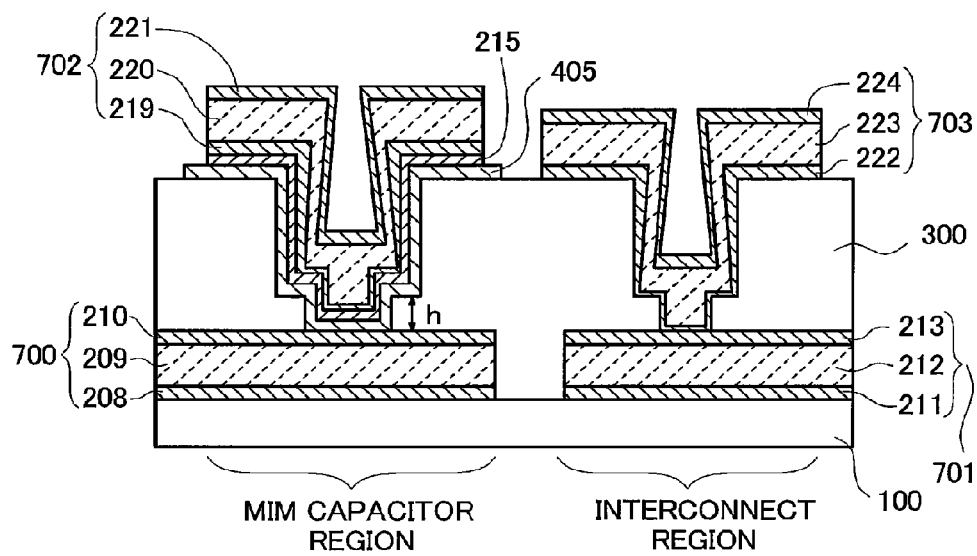
FIG. 1 is a cross sectional schematic view for a main portion of a manufacturing step of a semiconductor device according to a first embodiment according to the present invention.
Figure 2:
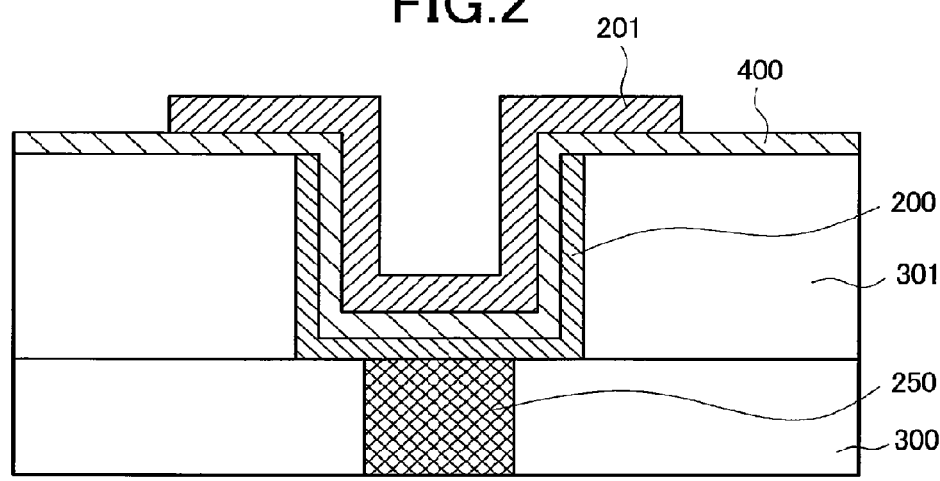
FIG. 2 is a cross sectional schematic view for a main portion of a manufacturing step of a semiconductor device based on a first conventional example.
Figure 3:
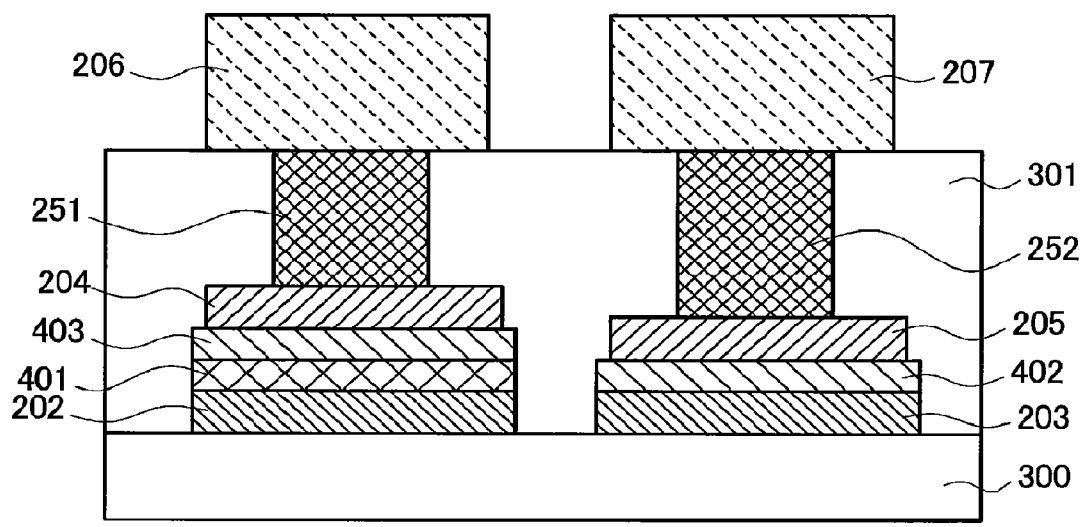
FIG. 3 is a cross sectional schematic view for a main portion of a manufacturing step according to the present invention based on a second conventional example.

Then, by conducting dry etching using the third and the fourth photoresists as a fabrication mask, a semiconductor device having an MIM capacitor constituted with the first metal interconnect 700, the fabricated capacitance film 405, the fabricated upper electrode 215 and the third metal interconnect 702, and a multilevel interconnect constituted with the second metal interconnect 701 and the fourth metal interconnect 703 can be formed as shown in FIG. 1.

Figure 6:
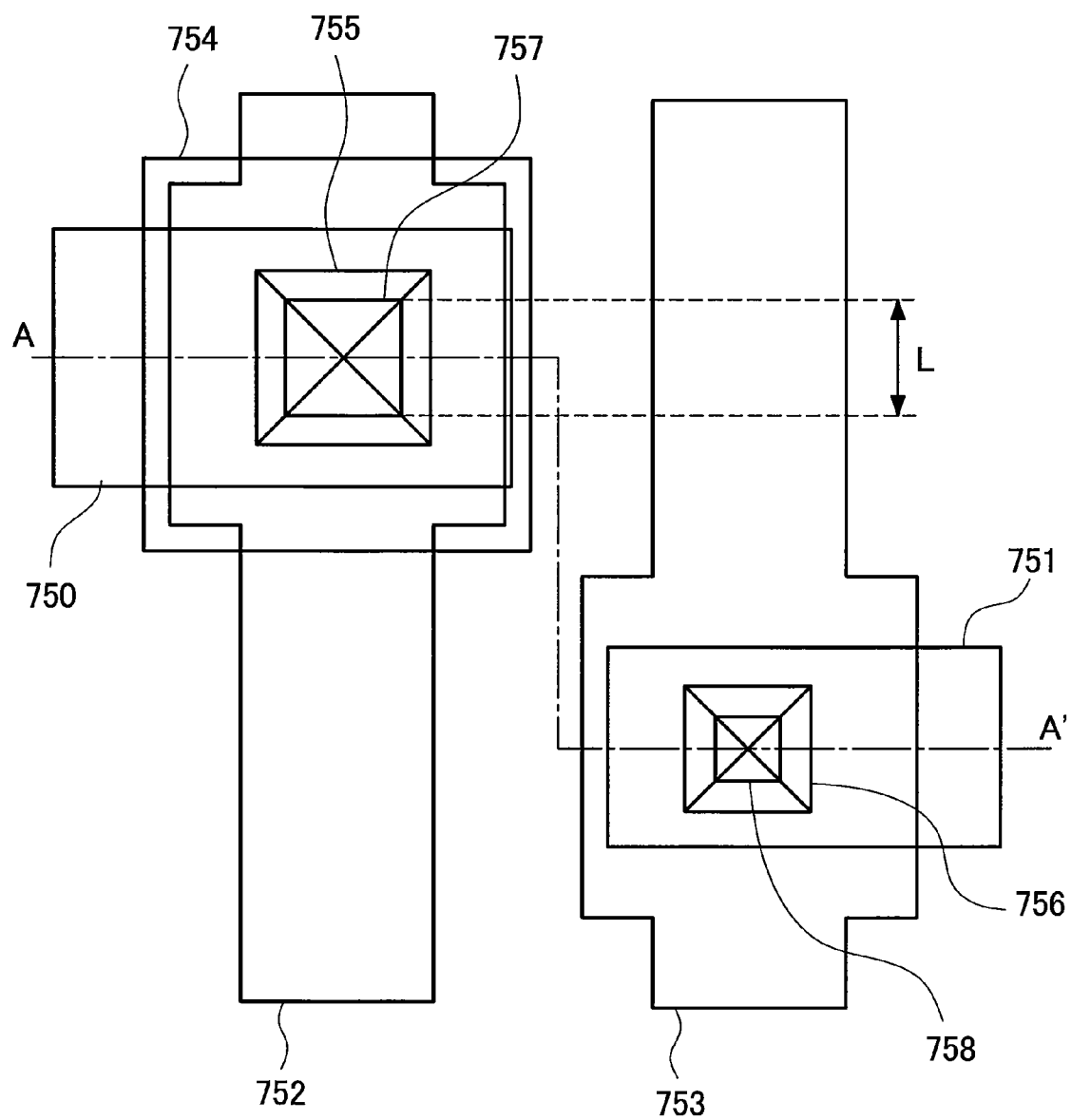
FIG. 6 is a schematic planar layout view according to the first embodiment of the present invention.

FIG. 6 shows a planar layout view of the MIM capacitor formed by the steps described above. Cross sectional views shown in FIG. 1, FIG. 4, and FIG. 5 are cross sections between A-A' in FIG. 6. In the layout view shown in FIG. 6, the MIM capacitor comprises a first metal interconnect 750, a capacitance film 754 of the MIM capacitor, and a third metal interconnect 752. However, only a portion within the region shown by a third opening 757 functions as a capacitance element. Since the side length of the third opening 757 (L in FIG. 6) is 1 μm, the capacitor area is 1 μm square. Further, in adjacent with the MIM capacitor, interconnect comprising a second metal interconnect 751, a second opening 756, a fourth opening 758, and a fourth metal interconnect 753 is laid.

In the first embodiment, several structures were prepared while changing the side length (L in FIG. 6) and the height of the step (h in FIG. 1) of the third opening. For comparison, structures using the steps shown in the first existent embodiment and the second existent embodiment were also manufactured. Capacitors of the first embodiment, the first existent embodiment and the second existent embodiment of B type, the capacitance density in the planar portion was designed to be about 12 fF per 1 μm square. Further, in the second embodiment of type A capacitor, the capacitance density was designed so as to be 2 fF per 1 μm square.

Figure 7:
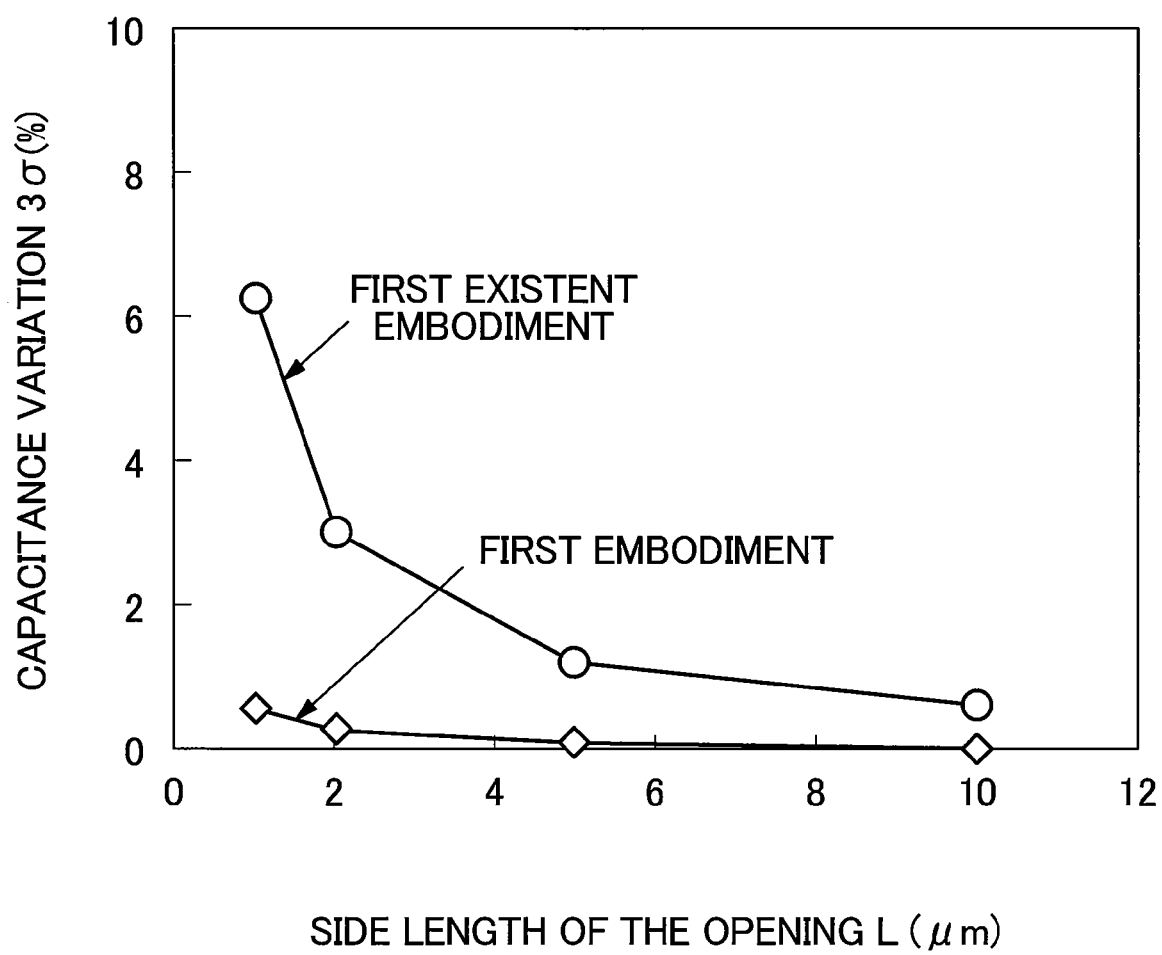
FIG. 7 is a graph showing a relation between the capacitance variation and the side length of the opening of a capacitor in an MIM capacitor.

The performance of the MIM capacitor of the semiconductor device formed as described above was examined. FIG. 7 shows a result comparing the performances of the first embodiment and the first existent embodiment. In the first existent embodiment, the capacitance variation of MIM capacitor was large and, particularly, since the variation of the capacitance value increased greatly when the side length L for the opening of the capacitor was shortened, it is difficult to form a capacitor of a small capacitance at a high accuracy. On the other hand, according to the first embodiment of the invention, variation of the capacitance can be suppressed and, further, since the variation can be suppressed even when the side length of the capacitor is shortened, it is possible to make high capacitance density and high capacitance accuracy compatible. Also in the MIM capacitor according to the second existent embodiment, an identical capacitance accuracy with that in the first embodiment of the invention was obtained. Then, the reliability of each MIM capacitor was evaluated. As a result of measurement for the dielectric breakdown field strength and the leakage current, the first embodiment of the invention and the first existent embodiment had a breakdown field strength of about 7 V and also the variation of the leakage current was within an allowable range. On the other hand, the second existent embodiment provided a result that the breakdown field strength was 5 V or lower and the variation of the leakage current and the yield were out of the allowable range.

A semiconductor device having an MIM capacitor capable of making high capacitance density and high capacitance accuracy compatible while having high reliability can be formed in accordance with the embodiment of the invention by forming the interlayer dielectric film comprising silicon oxide so as to cover the first metal interconnect, then forming a first opening to a region corresponding to the via hole layer in the interlayer dielectric film just above the first metal interconnect so as not to expose the upper surface of the first metal interconnect, then forming the second opening to the inside of the first opening so as to expose the surface of the first metal interconnect, and then forming the capacitance film and the third metal interconnect thereby forming the MIM capacitor constituted with the first metal interconnect, the capacitance film, and the third metal interconnect.

Figure 8:
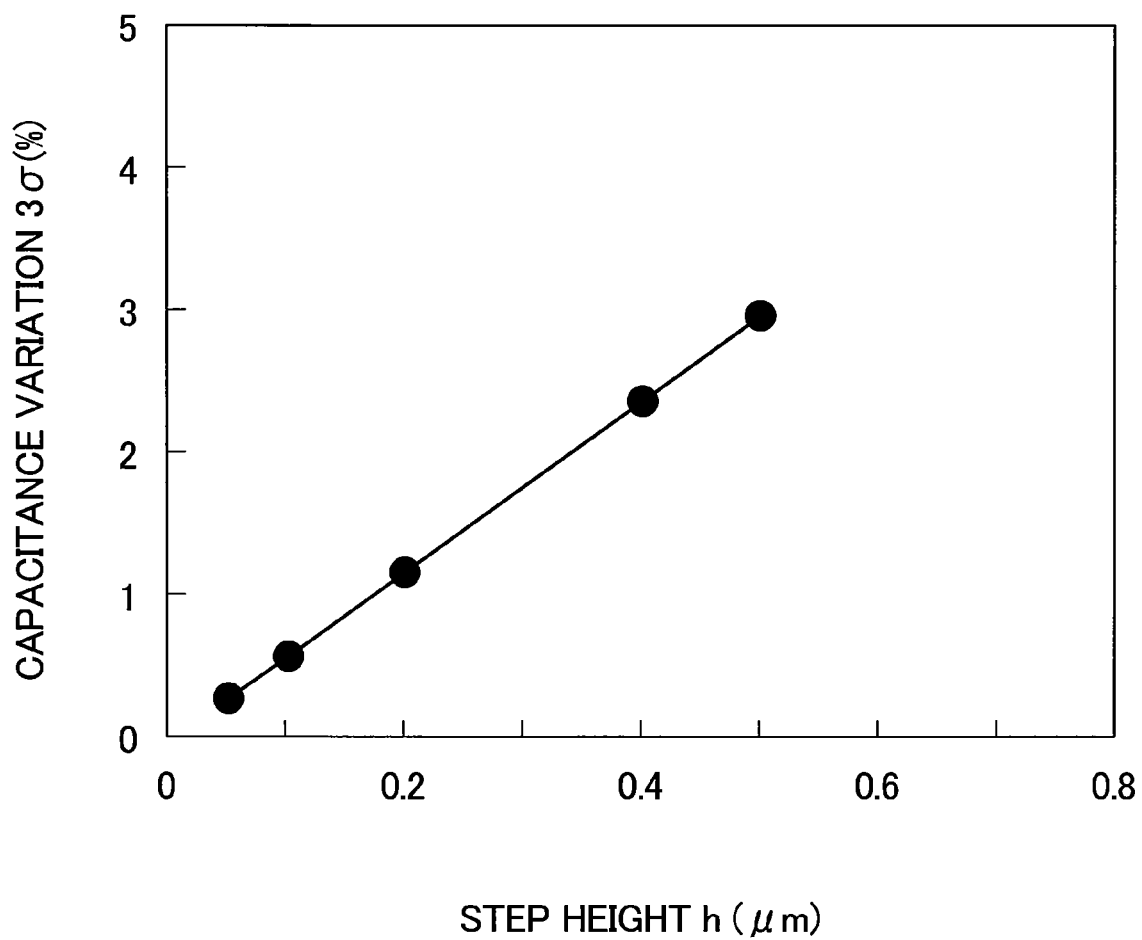
FIG. 8 is a graph showing a relation between the capacitance variation and a height of the step in an MIM capacitor.

In this embodiment, since the interlayer dielectric film of 100 nm thickness is left to the first metal interconnect upon forming the first opening, the height of the step (h in FIG. 1) is 100 nm. The height of the step h can be changed by adjusting the etching condition upon forming the first opening. FIG. 8 shows the capacitance variation of the MIM capacitor manufactured while changing the height of the step. The side length L of the capacitor opening is 1 μm. It can be seen that the capacitance variation decreases as the height of the step is decreased. However, a preferred lower limit is present for the height of the step. Since the height of the step is defined by the etching amount upon forming the first opening, the height of the step may possibly vary by the fluctuation of the etching condition. In an extreme case, the height of the step is decreased to 0 nm and the capacitance variation increases abruptly to increase the variation about to a level identical with that in the first existent embodiment. Further, the stepped portion functions as a coupling capacitance and the coupling capacitance increases as the height of the step is smaller to cause deviation of the capacitance value from the designed value. In a case where the height of the step is 50 nm, the portion of the coupling capacitance is substantially negligible. While the coupling capacitance decreases as the height of the step is larger, this increases the capacitance variation. Since the allowable value for the capacitance variation is 2%, it is desirable that the height of the step is 300 nm or less.

Further, in this embodiment, it is designed such that the center for the first opening is aligned with that for the second opening, and the edge of the first opening is defined at a position apart by 100 nm from the edge of the second opening but the edge gap is not always restricted to 100 nm. In a case where the gap is narrowed exceeding of the aligning margin in the lithographic step, the stepped portion is not formed and capacitance variation increases. While the alignment or fabrication is facilitated more when the edge gap is made larger, this results in a problem of increase in the coupling capacitance and increase in the occupying area. Accordingly, it is desired that the gap is narrowed within a range of the aligning margin in the lithographic step. It is not always necessary that the center is aligned for each of the openings and the center may be offset optionally.

Further, while the planar shape for the first opening and the second opening is made as a square shape, the usefulness of this embodiment is not restricted thereto. In addition to the square shape, a rectangular shape, a circular shape, an elliptic shape, a trigonal shape, a rhombic shape, or a combined shape may also be used.

Further, in this embodiment, only one second opening is formed in the first opening but a plurality openings may be formed optionally.

In this embodiment, hafnium oxide of 15 nm thickness was used as the capacitance film, but the film thickness and the material are not restricted to them. Since the capacitance density increases in inverse proportion to the thickness of the capacitance film, the film thickness is preferably thinner in view of the capacitance density. However, since the breakdown field strength is deteriorated in accordance as the film thickness is decreased, a limit is present for the reduction of the film thickness depending on the voltage to be used. Further, as the material for the capacitance film, silicon oxide, silicon nitride, tantalum oxide, zirconium oxide, lanthanum oxide, titanium oxide, or aluminum oxide, as well as a mixture thereof and a compound incorporated with nitrogen thereto can also be used in addition to the hafnium oxide. Further, a ferrodielectric material such as PZT, STO, and BST can also be used. Further, while a single layered dielectric film is used as the capacitance film in this embodiment.

Further, while titanium nitride of 50 nm film thickness formed by the CVD method is used for the formation of the upper electrode in this embodiment, other film thicknesses, materials, film deposition methods than those shown above can also be used. In a case of using a sputtering method, low temperature formation is possible but the amount of damages during film deposition increases. In a case where the film thickness is reduced, damages during fabrication tend to remain in the capacitance film. On the other hand, if it is extremely thick, this results in a problem of increasing the coupling resistance. Further, as materials other than titanium nitride, metals such as tungsten, molybdenum, tantalum, and nitrides thereof as the main component can also be used.

Further, in this embodiment, while titanium nitride is used as the barrier metal for the first, second, third, and fourth metal interconnects, metals such as tantalum, tungsten, and nitrides thereof as the main component can also be used in addition to titanium nitride. Further, a structure not using the barrier metal can also be utilized so long as there is a margin in view of the reliability. Further, a stacked structure comprising a plurality of layers can be used both for the upper electrode and the barrier metal with no particular problems.

Further, in this embodiment, while the opening formed in the first interlayer dielectric film is filled with a stacked film of the barrier metal and aluminum formed by the sputtering method, the opening can also be filled with other materials and by other forming methods. A method of filling tungsten formed by a CVD method is well-known, and the metal can be filled reliably by using the method even in an opening which is small and deep in the opening size.

Further, while description has been made in this embodiment to a step of using the silicon oxide film mainly as the first interlayer dielectric film, as an example, the film is not restricted to the material but it is also possible to use a Low-k material (dielectric material of low dielectric constant) capable of decreasing the coupling capacitance of the interconnect. As the Low-k material, an SiOC film (carbon-doped silicon oxide film), organic polymer film, or Low-k material introducing pores to them, fluorine-containing silicon oxide film, etc can also be used.

Second Embodiment

Figure 9A:
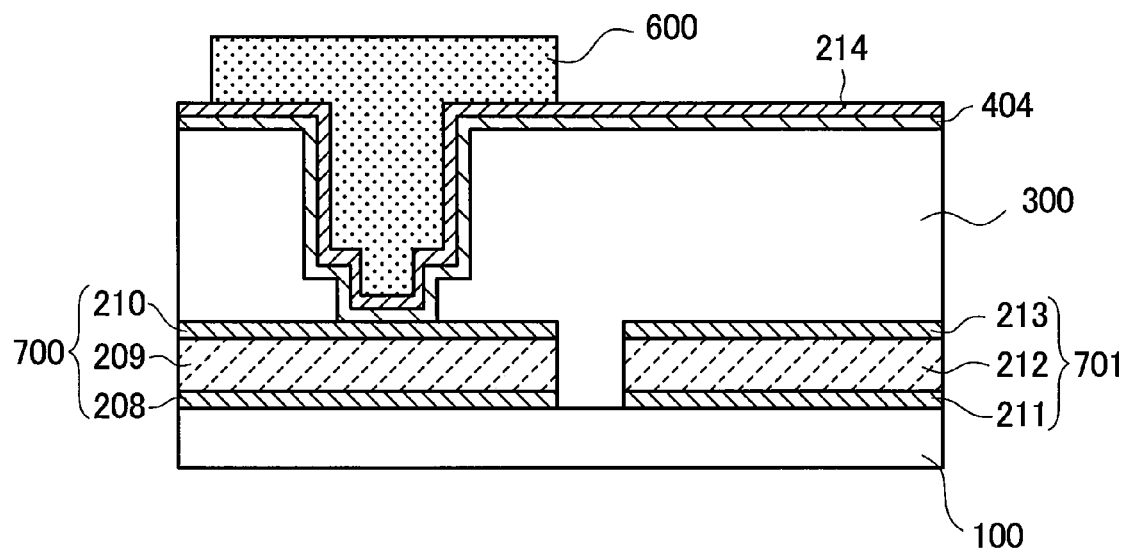
FIG. 9A is a cross sectional schematic view for a main portion of a manufacturing step of a semiconductor device according to a second embodiment of the present invention.
Figure 9B:
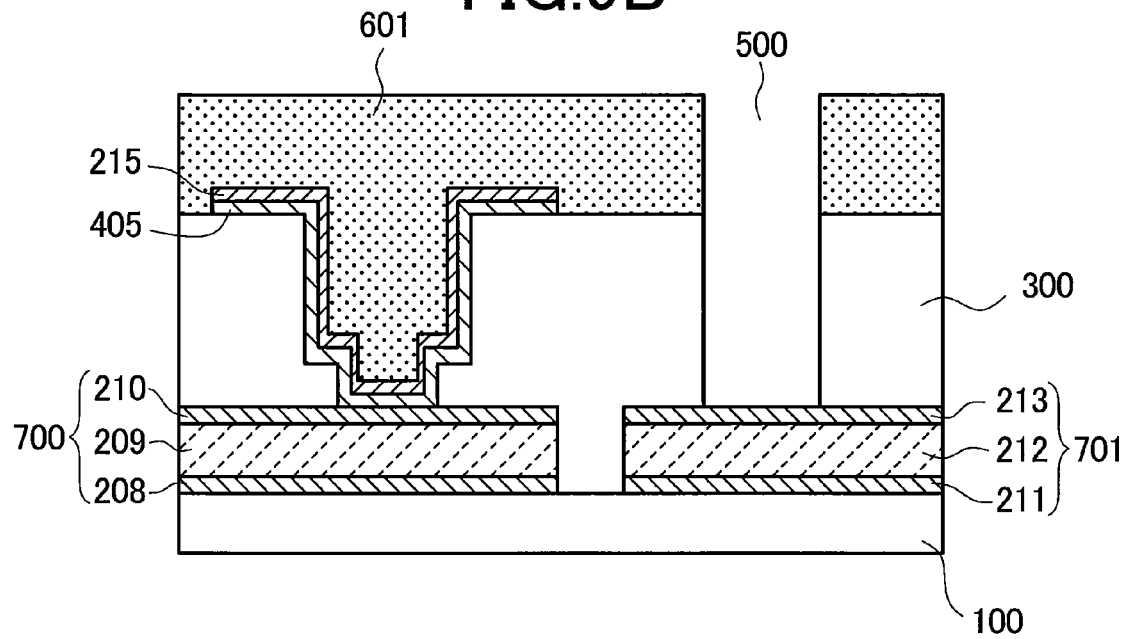
FIG. 9B is a cross sectional schematic view for a main portion of a manufacturing step of a semiconductor device according to the second embodiment of the present invention.
Figure 10:
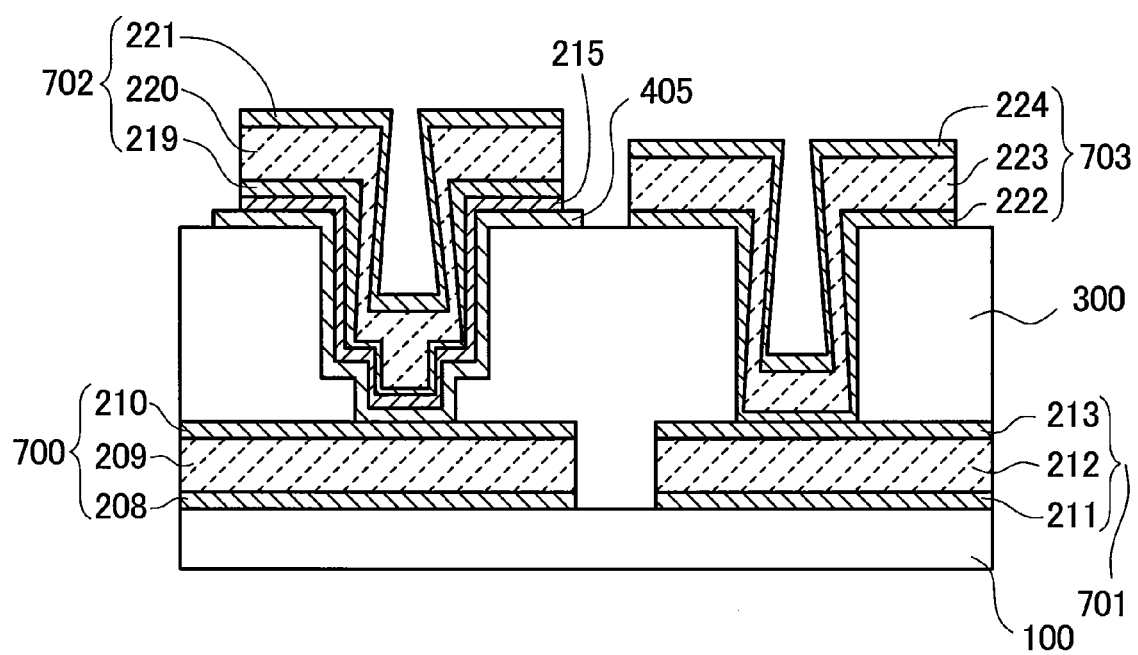
FIG. 10 is a cross sectional schematic view for a main portion of a manufacturing step of a semiconductor device according to the second embodiment of the present invention.

This embodiment is one of application examples of the first embodiment and the embodiment is to be described with reference to cross sectional views showing the manufacturing steps of the semiconductor device shown in FIG. 9 and FIG. 10. Description is to be made successively.

After forming titanium nitride of 50 nm film thickness, aluminum of 400 nm film thickness and titanium nitride of 50 nm film thickness on a substrate 100 formed with a semiconductor device by using a sputtering method, a first metal interconnect 700 comprising a first barrier metal layer 208, a first aluminum layer 209, and a second barrier metal 210, and a second metal interconnect 701 comprising a third barrier metal layer 211, a second aluminum layer 212, and a fourth barrier metal 213 were formed by using a lithographic method and a dry etching method.

Then, a silicon oxide film of 2 μm thickness was formed by using a plasma CVD method to form a first interlayer dielectric film 300. Then, after improving the planarization of the first interlayer dielectric film with a chemical-mechanical polishing method, an opening was formed to the first interlayer dielectric film 300 just above the first metal interconnect 700 at a region intended to form an MIM capacitor. In this case, the planar shape of the opening formed in the first interlayer dielectric film 300 was formed as a square shape with 1.2 μm side length and the depth of the opening was defined to 1 μm, and the thickness of silicon oxide remaining between the first metal interconnect 700 and the bottom of the opening to 100 nm.

Then, a photosensitive organic polymer film having an opening was formed in the inside of the opening described above by using a lithographic method. The opening formed in the photosensitive organic polymer film is in planar square shape with 1 μm side length and formed in such a shape as completely included to the inside of the opening formed in the first interlayer dielectric film 300. Then, the first interlayer dielectric film 300 was fabricated by using a dry etching method to expose the upper surface of the first metal interconnect 700. Then, after removing the photosensitive organic polymer film, a capacitance film 404 comprising hafnium oxide of 15 nm film thickness formed by an ALD method and an upper electrode film 214 comprising titanium nitride of 50 nm film thickness formed by a CVD method were formed successively. Then, a first fabrication resist 600 comprising a photosensitive organic polymer film was formed so as to cover a region intended to function as a capacitor is formed by using a lithographic method (FIG. 9A).

Then, after removing the unnecessary portion of the upper electrode film 214, and the capacitance film 404 by using the first fabrication resist 600 as an etching mask to form a fabricated upper electrode 215 and a fabricated capacitance film 405, the first fabrication resist 600 was removed. Then, the process goes to the step of forming a via hole in the interconnect portion. As shown in FIG. 9B, after forming a second fabrication resist 601 comprising a photosensitive organic polymer film so as to have an opening in a region intended to form the via hole, a first opening 500 was formed to the first interlayer dielectric film 300 so as to expose the surface of the second metal interconnect 701 using the fabrication resist as a fabricated mask. The opening is in a square shape with the side lateral length of 1.2 µm.

Then, after removing the second fabrication resist 601, a titanium nitride of 50 nm film thickness, aluminum of 400 nm film thickness, and titanium nitride of 50 nm film thickness were formed by using a sputtering method, and a photosensitive organic polymer film was formed so as to cover the portion intended to be left as the interconnect by using a lithographic method. Then, by conducting dry etching using the photosensitive organic polymer film as a fabrication mask, it is possible to form a semiconductor device as shown in FIG. 10 having an MIM capacitor constituted with the first metal interconnect 700, a fabricated capacitance film 405, the fabricated upper electrode 215, and the third metal interconnect 702, and a multilevel interconnect layer comprising a second metal interconnect 701 and a fourth metal interconnect 703. In the second embodiment, while the planar layout as shown in the first embodiment is not illustrated, this is basically according to the layout shown in FIG. 6. However, since the step is not present in the via hole between the second metal interconnect 701 and the fourth metal interconnect 703, it is different in that the second opening 756 forms the via hole as it is.

As a result of examining the performance and the reliability of the MIM capacitor in the semiconductor device having the thus formed MIM capacitor, capacitance density, breakdown field strength, and leakage current substantially same as those shown in the first embodiment were obtained and substantially the same effect was obtained also for the variation in each of the performances.

That is, it is possible to form a semiconductor device having an MIM capacitor capable of making high capacitance density and high capacitance accuracy compatible while having high reliability in accordance with the preferred embodiment of the invention by forming an interlayer dielectric film comprising silicon oxide so as to cover the first metal interconnect, then forming a first opening to the interlayer dielectric film in a region corresponding to the via hole layer of the interlayer dielectric film just above the first metal interconnect so as not to expose the upper surface of the first metal interconnect, forming a second opening to the inside of the first opening so as to expose the surface of the first metal interconnect, then forming the capacitance film and the third metal interconnect, thereby forming the MIM capacitor constituted with the first metal interconnect, the capacitance film, and the third metal interconnect.

In this embodiment, different from the first embodiment, formation of the opening in the portion of the MIM capacitor and formation of the via hole in the interconnect region are conducted by using separate lithographic step and dry etching step. While there is a problem of increasing the number of steps compared with the first embodiment, since the step is not formed in the inside of the via hole, it has an advantage that the via hole resistance is low and the conduction yield can be improved easily.

While the height of the step formed to the interlayer dielectric film is 100 nm in this embodiment, the height of the step can be changed optionally. With the reason described for the first embodiment, the height of the step is preferably within a range from 50 nm to 300 nm.

Further, while the first opening and the second opening are laid out such that the centers thereof are aligned and the edge of the first opening is laid out at a position apart by 100 nm from the edge of the second opening, the layout can be changed optionally. With the same reason as described for the first embodiment, it is desirable to narrow the edge gap within a range of the aligning margin in the lithographic step and it is not always necessary that the centers for the respective openings are aligned.

Further, while the planar shape for the first opening and the second opening is made square, the usefulness of this embodiment is not restricted thereto. In addition to the square shape, a rectangular shape, a circular shape, an elliptic shape, a trigonal shape, a rhombic shape, or a combined shape may also be used.

Further, in this embodiment, while only one second opening is formed in the first opening, a plurality of openings may be formed optionally.

In this embodiment, while hafnium oxide of 15 nm film thickness was used for the capacitance film, the film thickness and the material are not restricted to them. Further, as the material for the capacitance film, in addition to the hafnium oxide, silicon oxide, silicon nitride, tantalum oxide, zirconium oxide, lanthanum oxide, titanium oxide, or aluminum oxide, as well as a mixture thereof and a compound incorporated with nitrogen thereto can also be used. Further, a ferrodielectric material such as PZT, STO, and BST can also be used. Further, the capacitance film may be optionally in a stacked structure.

Further, in this embodiment, while titanium nitride of 50 nm film thickness formed by the CVD method is used for formation of the upper electrode, other film thicknesses, materials, and film deposition methods than those described above can also be used. As other materials than titanium nitride, metals including tungsten, molybdenum, tantalum, and nitrides thereof as the main component can also be used.

Further, in this embodiment, while titanium nitride is used as the barrier metal for the first, second, third, and fourth metal interconnects, metals such as tantalum, tungsten, and nitrides thereof as the main component can also be used in addition to titanium nitride. Further, a structure not using the barrier metal can also be utilized so long as there is a margin in view of the reliability. Further, a stacked structure comprising a plurality of layers can be used both for the upper electrode and the barrier metal with no particular problems.

Further, in this embodiment, while the opening formed in the first interlayer dielectric film is filled with a stacked film of the barrier metal and aluminum formed by the sputtering method, the opening can also be filled with other materials and by other forming methods. A method of filling tungsten formed by a CVD method is well-known, and the metal can be filled reliably by using the method even in an opening which is small and deep in the opening size.

Further, while description has been made in this embodiment to a step of using the silicon oxide film mainly as the first interlayer dielectric film as an example, the film is not restricted to the material but it is also possible to use a Low-k material (dielectric material of low dielectric constant) capable of decreasing the coupling capacitance of the interconnect. As the Low-k material, an SiOC film (carbon-doped silicon oxide film), organic polymer film, or Low-k material introducing pores to them, fluorine-containing silicon oxide film, etc can also be used.

Third Embodiment

Figure 11A:
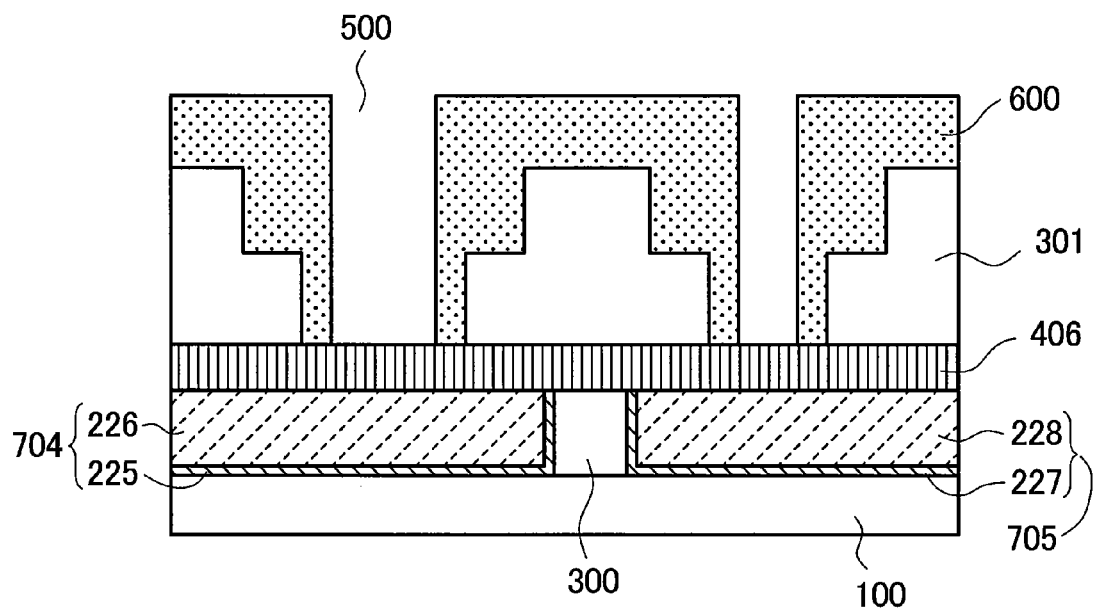
FIG. 11A is a cross sectional schematic view for a main portion of a manufacturing step of a semiconductor device according to a third embodiment of the present invention.
Figure 11B:
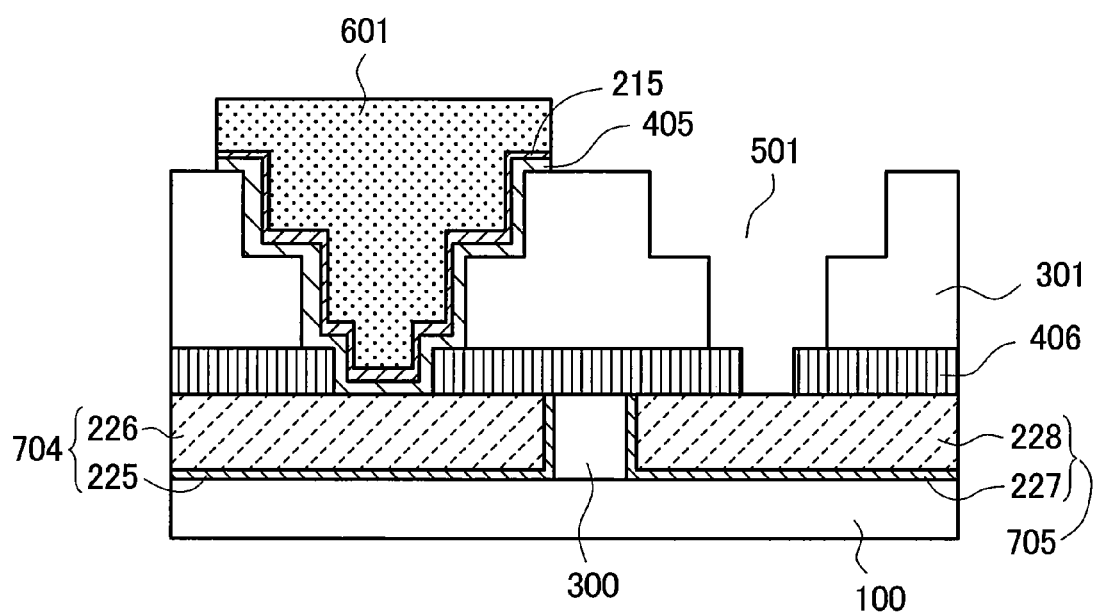
FIG. 11B is a cross sectional schematic view for a main portion of a manufacturing step of a semiconductor device according to the third embodiment of the present invention.
Figure 12:
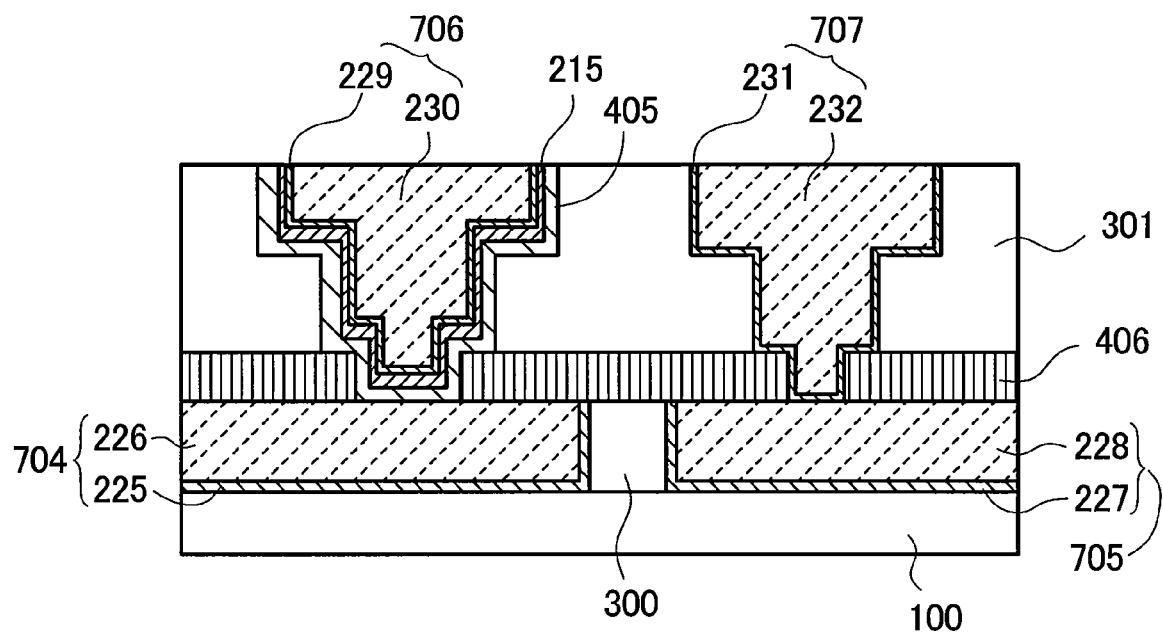
FIG. 12 is a cross sectional schematic view for a main portion of a manufacturing step of a semiconductor device according to the third embodiment of the present invention.

FIG. 11 and FIG. 12 are cross sectional views showing manufacturing steps of a semiconductor device according to the invention. Description is to be made successively.

As shown in FIG. 11A, a silicon oxide film of 500 nm thickness was formed on a substrate 100 formed with a semiconductor device by using a plasma CVD method to form a first interlayer dielectric film 300. Then, a photosensitive organic polymer film was formed so as to have an opening in a region intended to form an interconnect, and a desired region of the first interlayer dielectric film 300 was removed by a dry etching method using the film as a fabrication mask. Then, after forming tantalum of 50 nm film thickness and a copper film of 100 nm thickness by a sputtering method, and after growing the copper film further by an electroplating method, excessive tantalum film and copper film on the first interlayer dielectric film 300 were removed by using a chemical-mechanical polishing method to form a fifth metal interconnect 704 comprising a first adhesive layer 225 comprising tantalum of 50 nm film thickness and a first copper layer 226 comprising a copper film of 450 nm thickness, and a sixth metal interconnect 705 comprising a second adhesive layer 227 comprising tantalum of 50 nm film thickness and a second copper layer 228 comprising a copper film of 450 nm thickness. Then, a barrier dielectric film 406 comprising silicon nitride of 100 nm film thickness formed by a plasma CVD method and a second interlayer dielectric film 301 comprising a silicon oxide of 1.5 μm film thickness formed by a plasma CVD method were formed successively.

Then, a via hole and an interconnect trench were formed by using a fabrication process referred to as a trench first-type dual damascene method. Specifically, after forming a photosensitive organic polymer film so as to have an opening in a region intended to be utilized as an interconnect of the second interlayer dielectric film, the second interlayer dielectric film was etched by a depth of 500 nm, which is assumed for the height of the interconnect, by using a dry etching method to form a interconnect trench. Then, after removing the photosensitive organic polymer film, a photosensitive organic polymer film was formed so as to have an opening in a region intended to form a via hole by using lithographic method. Then, dry etching was applied to the second interlayer dielectric film 301 using a photosensitive organic polymer film as a fabrication mask to expose the surface of the first barrier dielectric film. Then, after removing the photosensitive organic polymer film, a first fabrication resist 600 comprising the photosensitive organic polymer film was formed on the barrier dielectric film 406. The first fabrication resist has a first opening 500 at least above a region intended to form an MIM capacitor. The planar shape of the first opening was formed as a square shape of 1 μm side length.

Then, as shown in FIG. 11B, after forming an opening in the barrier dielectric film 406 so as to expose the surface of the sixth metal interconnect 705 by using the first fabrication resist 600 as a fabrication mask, the first fabrication resist 600 was removed. The step formed with the barrier dielectric film corresponds to the height of the step in the first embodiment. Then, after forming hafnium oxide of 15 nm film thickness formed by an ALD method, and titanium nitride of 50 nm film thickness formed by a CVD method, a second fabrication resist 601 comprising a photosensitive organic polymer film was formed so as to cover a region intended to serve as a capacitor by using a lithographic method. Then, an unnecessary portion of hafnium oxide and titanium nitride was removed by using the second fabrication resist 601 as an etching mask and a fabricated upper electrode 215 comprising titanium nitride of 50 nm film thickness and a fabricated capacitance film 405 comprising hafnium oxide of 15 nm film thickness were formed.

Then as shown in FIG. 12, after forming tantalum of 50 nm film thickness and a copper film of 100 nm thickness by a sputtering method and after growing the copper film by an electroplating method, excess tantalum film and copper film on the second interlayer dielectric film 301 were removed by using a chemical-mechanical polishing method to form a seventh metal interconnect 706 comprising a third adhesive layer 229 comprising tantalum of 50 nm film thickness and a third copper layer 230 comprising a copper film of 450 nm thickness, and an eighth metal interconnect 707 comprising fourth adhesive layer 231 comprising tantalum of 50 nm film thickness and a fourth copper layer 232 comprising a copper film of 450 nm thickness. As described above, it is possible to form a semiconductor device having an MIM capacitor comprising a fifth metal interconnect 704, a fabricated capacitance film 405, a fabricated upper electrode 215, and a seventh metal interconnect 706.

Figure 13:
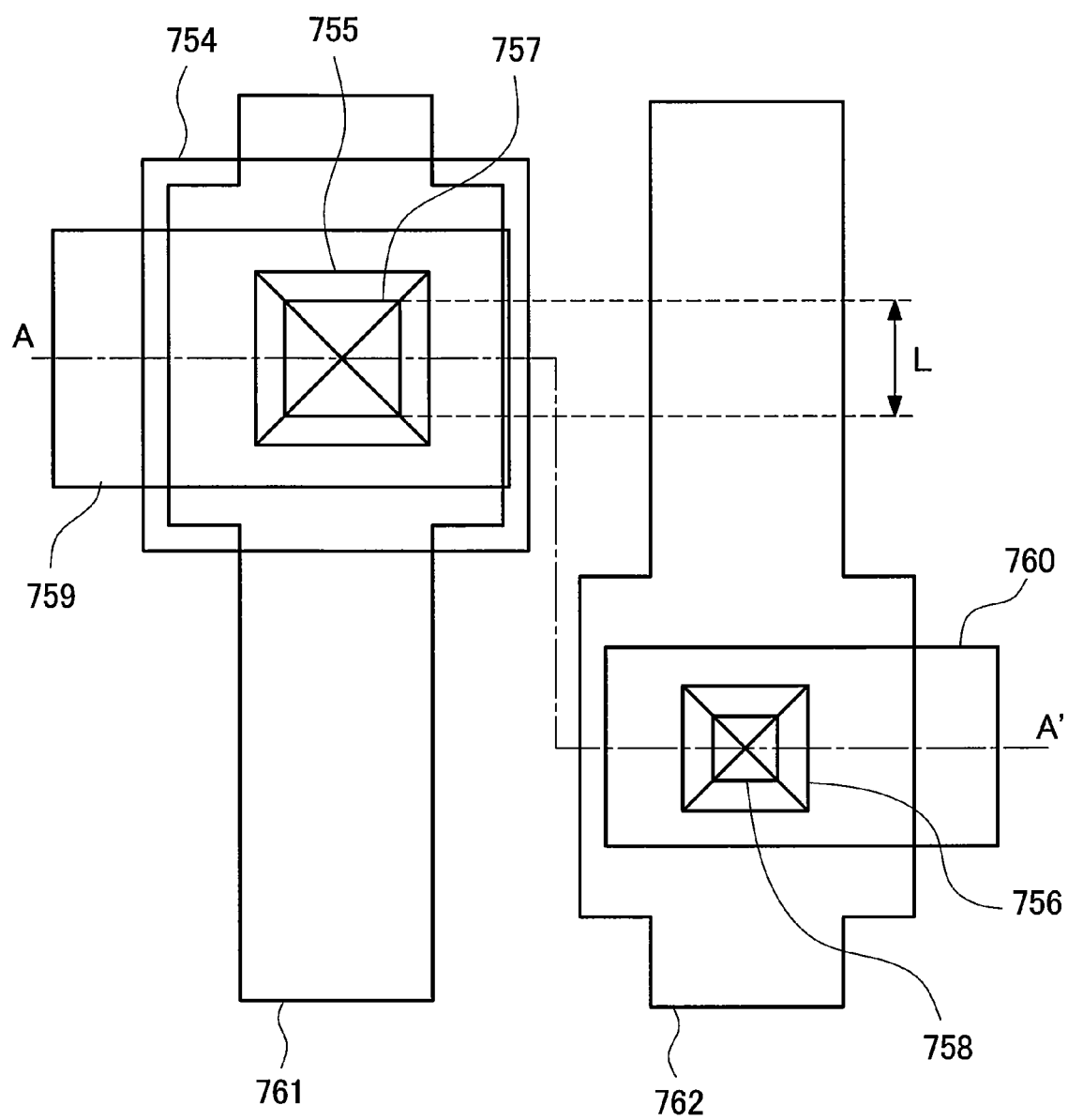
FIG. 13 is a schematic view for a planar layout according to the third embodiment of the present invention.

FIG. 13 shows a planar layout view of the MIM capacitor formed by the steps described above. Cross sectional views shown in FIG. 11, and FIG. 12 are cross sections between A-A' in FIG. 13. In the layout view shown in FIG. 13, the MIM capacitor comprises a fifth metal interconnect 759, a capacitance film 754 of the MIM capacitor, and a seventh metal interconnect 761. However, what functions actually as a capacitance is only the inside of the region shown by a third opening 757. Since the side length of the third opening 757 (L in FIG. 13) is 1 μm, the capacitor area is 1 μm square. Further, in adjacent with the MIM capacitor, interconnect comprising a sixth metal interconnect 760, a second opening 756, a fourth opening 758, and the eighth metal interconnect 762 is laid.

As a result of examining the performance and the reliability of the MIM capacitor in the semiconductor device having the thus formed MIM capacitor, capacitance density, breakdown field strength, and leakage current substantially same as those shown in the first embodiment were obtained and substantially the same effect was obtained also for the variation in each of the performances.

That is, it is possible to form a semiconductor device having an MIM capacitor capable of making high capacitance density and high capacitance accuracy compatible while having a high reliability in accordance with the embodiment of the invention by forming the barrier dielectric film and the second interlayer dielectric film so as to cover the fifth metal interconnect, then forming the first opening to a region corresponding to the via hole layer in the second interlayer dielectric film just above the fifth metal interconnect, to the interlayer dielectric film so as to expose the surface of the barrier dielectric film, then forming the second opening to the barrier dielectric film in the region inside of the first opening so as to expose the surface of the fifth metal interconnect, then forming the capacitance film and the seventh metal interconnect thereby forming the MIM capacitor comprising the fifth metal interconnect, the capacitance film, and the seventh metal interconnect.

In this embodiment, different from the first embodiment, the damascene method is used as the step of forming the metal interconnect. The damascene method is suitable for the formation of a copper interconnect of low resistance. Since the planarization of the interconnect is easy, it has an advantage capable of improving the performance of the interconnect easily.

In this embodiment, since the thickness of the barrier dielectric film is 100 nm, the height of the step is 100 nm. The height of the step can be changed optionally. With the reasons described for the first embodiment, the height of the step is preferably within a range from 50 nm to 300 nm. Further, since the etching is stopped at the instance the barrier dielectric film appears upon formation of the first opening, the thickness of the barrier dielectric film forms the height of the step as it is. However, the effectiveness of the embodiment is not restricted only to the method. It is also possible to stop etching before the appearance of the barrier dielectric film optionally, or additionally etch the barrier dielectric film after the appearance of the barrier dielectric film. In this case, the gap between the surface of the fifth metal interconnect and the bottom of the first opening is the height of the step.

Further, while the first opening and the second opening are laid out such that the centers thereof are aligned and the edge of the first opening is laid out at a position apart by 100 nm from the edge of the second opening, the layout can be changed optionally. With the same reason as described for the first embodiment, it is desirable to narrow the edge gap within a range of the aligning margin in the lithographic step and it is not always necessary that the centers for the respective openings are aligned.

Further, while the planar shape for the first opening and the second opening is made square, the usefulness of this embodiment is not restricted thereto. In addition to the square shape, a rectangular shape, a circular shape, an elliptic shape, a trigonal shape, a rhombic shape, or a combined shape may also be used.

Further, in this embodiment, while only one second opening is formed in the first opening, a plurality of openings may be formed optionally.

In this embodiment, while hafnium oxide of 15 nm film thickness was used for the capacitance film, the film thickness and the material are not restricted to them. Further, as the material for the capacitance film, in addition to the hafnium oxide, silicon oxide, silicon nitride, tantalum oxide, zirconium oxide, lanthanum oxide, titanium oxide, or aluminum oxide, as well as a mixture thereof and a compound incorporated with nitrogen thereto can also be used. Further, a ferrodielectric material such as PZT, STO, and BST can also be used. Further, the capacitance film may be optionally in a stacked structure.

Further, in this embodiment, while titanium nitride of 50 nm film thickness formed by the CVD method is used for formation of the upper electrode, other film thicknesses, materials, and film deposition methods than those described above can also be used. As other materials than titanium nitride, metals including tungsten, molybdenum, tantalum, and nitrides thereof as the main component can also be used.

Further, while the fifth, sixth, seventh, and eighth metal interconnects are formed by the combination of tantalum and copper, other materials may also be used. In addition to tantalum, those metals comprising titanium, tungsten, molybdenum, and nitrides thereof as the main component can also be used and a metal layer in a stacked structure can also be used optionally. Further, instead of the copper film, aluminum, tungsten, titanium, and alloys and compounds thereof can also be used.

Further, while the capacitance film was used directly for the second opening formed in the barrier dielectric film, it is also possible to optionally cover the surface of the copper film exposed to the inside of the second opening with other conductor materials. For example, the metal can be grown selectively only on the surface of the copper film by using a selective CVD method or electroless plating method. By using the method, a sufficient reliability can be maintained also in a case of using a capacitance film material in which copper is diffused easily.

Further, while the trench-first-type dual damascene method was used as the fabrication method for the seventh and the eighth metal interconnects in this embodiment, the effectiveness of the method is not restricted to them. The same effect can also be expected by other dual damascene methods and a single damascene method of forming the interconnect trench and the via hole independently. In a case of the single damascene method, it is effective to apply the embodiment to the via hole forming process.

Further, while description has been made in this embodiment to a step of using the silicon oxide film mainly as the first and the second interlayer dielectric films as an example, the film is not restricted to the material but it is also possible to use a Low-k material (dielectric material of low dielectric constant) capable of decreasing the coupling capacitance of the interconnect. As the Low-k material, an SiOC film, organic polymer film, or Low-k material formed by introducing pores to them, fluorine-containing silicon oxide film, etc can also be used.

Fourth Embodiment

This embodiment is one of application embodiments of the third embodiment and the invention is to be described with reference to the cross sectional views of FIG. 14 and FIG. 15.

Figure 14A:
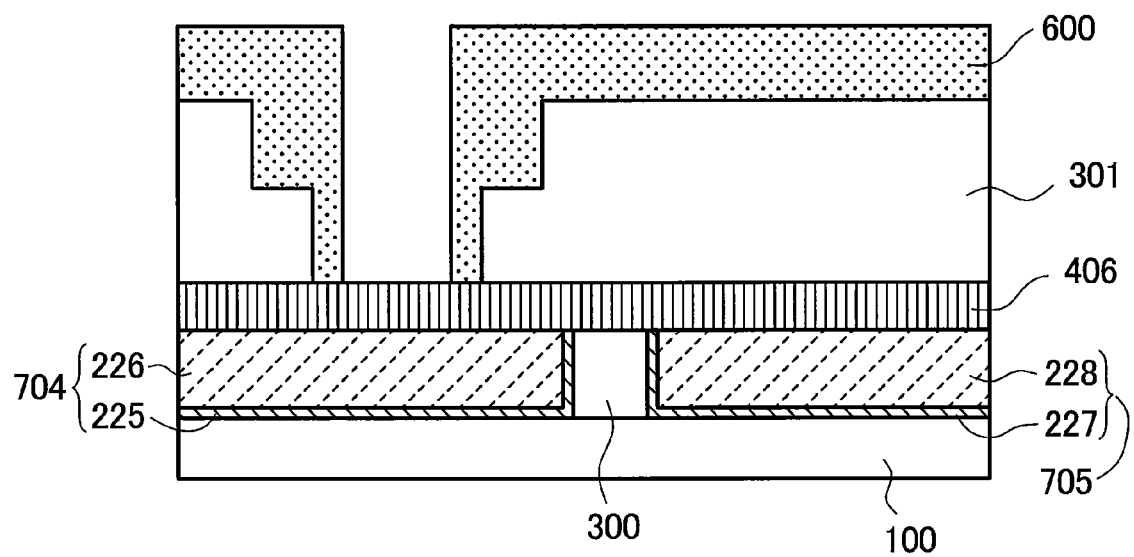
FIG. 14A is a cross sectional schematic view for a main portion of a manufacturing step of a semiconductor device according to a fourth embodiment of the present invention.

According to the steps shown in the third embodiment, a fifth metal interconnect 704 comprising a first interlayer dielectric film 300 comprising a silicon oxide film of 500 nm thickness formed by using a plasma CVD method, a first adhesive layer 225 comprising tantalum of 50 nm film thickness, and a first copper layer 226 comprising a copper film of 450 nm thickness, and a sixth metal interconnect 705 comprising a second adhesive layer 227 comprising tantalum of 50 nm thickness, and a second copper layer 228 comprising a copper film of 450 nm thickness were formed above substrate 100 formed with a semiconductor device. Then, after forming a barrier dielectric film 406 comprising silicon nitride of 100 nm thickness formed by a plasma CVD method and a second interlayer dielectric film 301 comprising silicon oxide of 1.5 μm thickness formed by a plasma CVD method successively, a via hole and an interconnect trench were formed by using a trench-first-dual damascene method. Then, a first fabricated resist 600 comprising photosensitive organic polymer film was formed on the barrier dielectric film 406. The first fabricated resist 600 has an opening at least on the region intended to form an MIM capacitor (FIG. 14A).

Figure 14B:
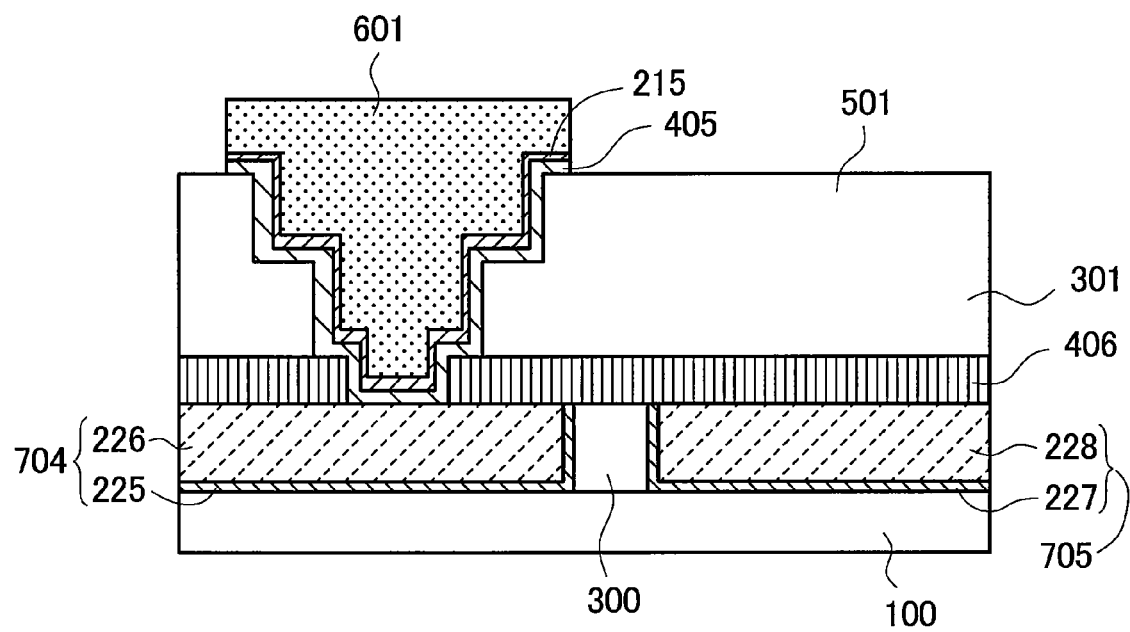
FIG. 14B is a cross sectional schematic view for a main portion of a manufacturing step of a semiconductor device according to the fourth embodiment of the present invention.

Then, as shown in FIG. 14B, after forming an opening in the barrier dielectric film 406 so as to expose the surface of the fifth metal interconnect 704 using the first fabrication resist 600 as a fabrication mask, the first fabrication resist 600 was removed. In this case, the step formed by the barrier dielectric film corresponds to the height of the step in the first embodiment. Then, after forming hafnium oxide of 15 nm film thickness formed by an ALD method and titanium nitride of 50 nm film thickness formed by a CVD method, a second fabrication resist 601 comprising a photosensitive organic polymer film was formed so as to cover a region intended to serve as the capacitor by using a lithographic method. Then, an unnecessary portion of hafnium oxide and titanium nitride was removed by using the second fabrication resist 601 as an etching mask, to form a fabricated upper electrode 215 comprising titanium nitride of 50 nm film thickness and a fabricated capacitance film 405 comprising hafnium oxide of 15 nm film thickness.

Figure 15A:
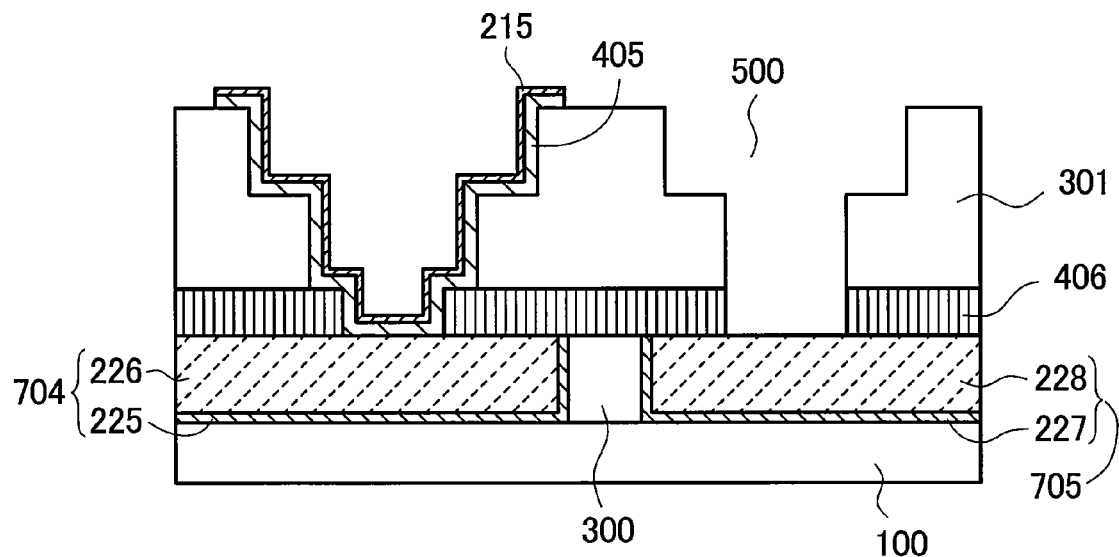
FIG. 15A is a cross sectional schematic view for a main portion of a manufacturing step of a semiconductor device according to the fourth embodiment of the present invention.

Then, as shown in FIG. 15A, after removing the second fabrication resist 601, a trench-first-type dual damascene step was applied again for forming a region to serve as the interconnect and the via hole to form a first opening 500 comprising an interconnect trench and a via hole having an opening in the sixth metal interconnect to the inside of the second interlayer dielectric film 301.

Figure 15B:
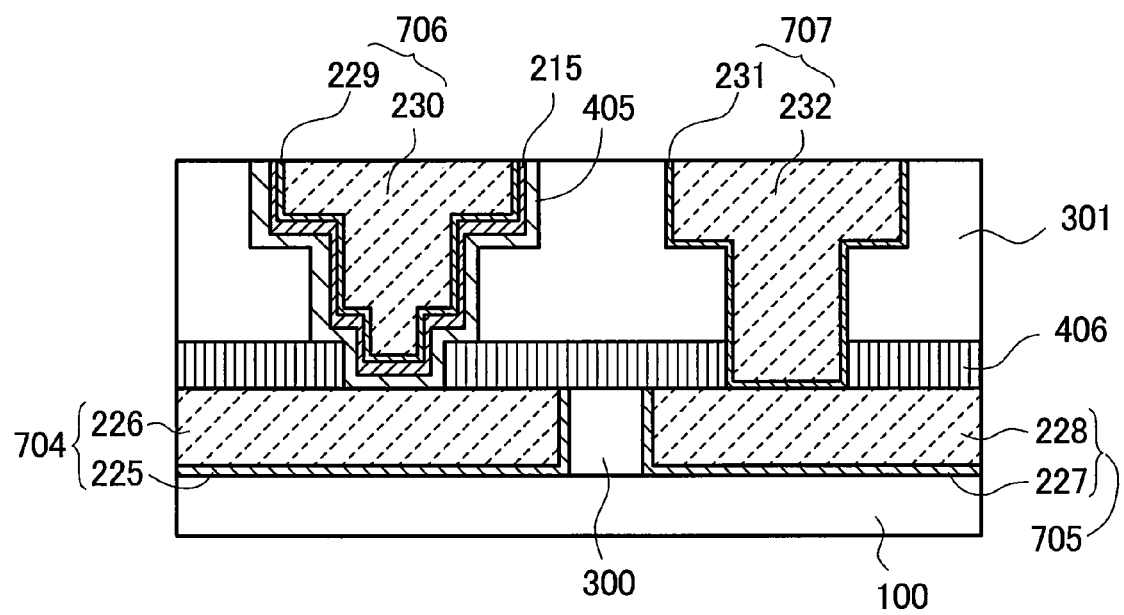
FIG. 15B is a cross sectional schematic view for a main portion of a manufacturing step of a semiconductor device according to the fourth embodiment of the present invention.

Then as shown in FIG. 15B, after forming tantalum of 50 nm film thickness and a copper film of 100 nm thickness by a sputtering method and after growing the copper film by an electroplating method, excess tantalum film and copper film on the second interlayer dielectric film 301 were removed by using a chemical-mechanical polishing method to form a seventh metal interconnect 706 comprising a third adhesive layer 229 comprising tantalum of 50 nm film thickness and a third copper layer 230 comprising a copper film of 450 nm thickness, and an eighth metal interconnect 707 comprising a fourth adhesive layer 231 comprising tantalum of 50 nm film thickness and a fourth copper layer 232 comprising a copper film of 50 nm thickness. As described above, it is possible to form a semiconductor device having an MIM capacitor comprising a fifth metal interconnect 704, a fabricated capacitance film 405, a fabricated upper electrode 215, and a seventh metal interconnect 706. In the fourth embodiment, a planar layout as shown in the third embodiment is not illustrated but this is basically according to the layout shown in FIG. 13. However, since the step is not present in the via hole between the sixth metal interconnect 705 and the eighth metal interconnect 707, it is different in that the second opening 756 forms the via hole as it is.

As a result of examining the performance and the reliability of the MIM capacitor in the semiconductor device having the thus formed MIM capacitor, capacitance density, breakdown field strength, and leakage current substantially same as those shown in the first embodiment were obtained and substantially the same effect was obtained also for the variation in each of the performances.

That is, it is possible to form a semiconductor device having an MIM capacitor capable of making high capacitance density and high capacitance accuracy compatible while having a high reliability in accordance with the embodiment of the invention by forming a barrier dielectric film and a second interlayer dielectric film so as to cover the fifth metal interconnect, then forming the first opening to the interlayer dielectric film in a region corresponding to the via hole layer in the second interlayer dielectric film just above the fifth metal interconnect so as to expose the surface of the barrier dielectric film, then forming the second opening in the barrier dielectric film in the region inside of the first opening so as to expose the surface of the fifth metal interconnect, then forming the capacitance film and the seventh metal interconnect thereby forming the MIM capacitor comprising the fifth metal interconnect, the capacitance film, and the seventh metal interconnect.

In this embodiment, different from the third embodiment, formation of the opening in the MIM capacitor portion and formation of the interconnect trench and the via hole in the interconnect region were conducted by using separate lithographic step and dry etching step. Although there exists a problem that the number of steps increases compared with the third embodiment, since the step is not formed in the inside of the via hole, it has an advantage that the via hole resistance is low and the conduction yield can be improved easily.

In this embodiment, since the thickness of the barrier dielectric film is 100 nm, the height of the step is 100 nm. The height for the step can be changed optionally. With the reasons described for the first embodiment, the height for the step is preferably within a range from 50 nm to 300 nm. Further, since the etching is stopped at the instance the barrier dielectric film appeared upon formation of the first opening, the thickness of the barrier dielectric film forms the height of the step as it is. However, the effectiveness of the embodiment is not restricted only to the method. It is also possible to stop etching before the appearance or development of the barrier dielectric film optionally, or additionally etch the barrier electric film after the appearance of the barrier dielectric film. In this case, the gap between the surface of the fifth metal interconnect and the bottom of the first opening is the height of the steps.

Further, while the first opening and the second opening are laid out such that the centers thereof are aligned and the edge of the first opening is laid out at a position apart by 100 nm from the edge of the second opening, the layout can be changed optionally. With the reason as described for the first embodiment, it is desirable to narrow the edge gap within a range of the aligning margin in the lithographic step and it is not always necessary that the centers for the respective openings are aligned.

Further, while the planar shape for the first opening and the second opening is made square, the usefulness of this embodiment is not restricted thereto. In addition to the square shape, a rectangular shape, a circular shape, an elliptic shape, a trigonal shape, a rhombic shape, or a combined shape may also be used.

Further, in this embodiment, while only one second opening is formed in the first opening, a plurality of openings may be formed optionally.

In this embodiment, while hafnium oxide of 15 nm film thickness was used for the capacitance film, the film thickness and the material are not restricted to them. Further, as the material for the capacitance film, in addition to the hafnium oxide, silicon oxide, silicon nitride, tantalum oxide, zirconium oxide, lanthanum oxide, titanium oxide, or aluminum oxide, as well as a mixture thereof and compounds incorporated with nitrogen to them can also be used. Further, a ferrodielectric material such as PZT, STO, and BST can also be used. Further, the capacitance film may be optionally in a stacked structure.

Further, in this embodiment, while titanium nitride of 50 nm film thickness formed by the CVD method is used for formation of the upper electrode, other film thicknesses, materials and film deposition methods than those described above can also be used. As other materials than titanium nitride, metals including tungsten, molybdenum, tantalum, and nitrides thereof as the main component can also be used.

Further, while the fifth, sixth, seventh, and eighth metal interconnects are formed by the combination of tantalum and copper, other materials may also be used. In addition to tantalum, those metals comprising titanium, tungsten, molybdenum, and nitrides thereof as the main component can also be used and a metal layer in a stacked structure can also be used optionally. Further, instead of the copper film, aluminum, tungsten, titanium, and alloys and compounds thereof can also be used.

Further, in this embodiment, while the capacitance film was formed directly to the surface of the fifth metal interconnect, the surface of the fifth metal interconnect may optionally be covered with other conductor materials. For example, the metal can be grown selectively only on the surface of the copper film exposed to the surface of the fifth metal interconnect by using a selective CVD method or an electroless plating method. By using the method, a sufficient reliability can be maintained also in a case of using a capacitance film material in which copper is diffused easily.

Further, while the trench-first dual damascene method was used as the fabrication method for the seventh and the eighth metal interconnects in this embodiment, the effectiveness of the method is not restricted thereto. The same effect can also be expected by other dual damascene methods and a single damascene method of forming the interconnect trench and the via hole independently. In a case of the single damascene method, it is effective to apply the embodiment of the invention to the via hole forming process.

Further, while description has been made in this embodiment to a step of using the silicon oxide film mainly as the first and the second interlayer dielectric films as an example, the film is not restricted to the material but it is also possible to use a Low-k material capable of decreasing the coupling capacitance of the interconnect. As the Low-k material, an SiOC film, organic polymer film, or Low-k material introducing pores to them, fluorine-containing silicon oxide film, etc can also be used.

Fifth Embodiment

FIG. 16, and FIG. 17 are cross sectional views showing the manufacturing step of a semiconductor device according to a fifth embodiment of the invention. They are to be described successively.

Figure 16A:
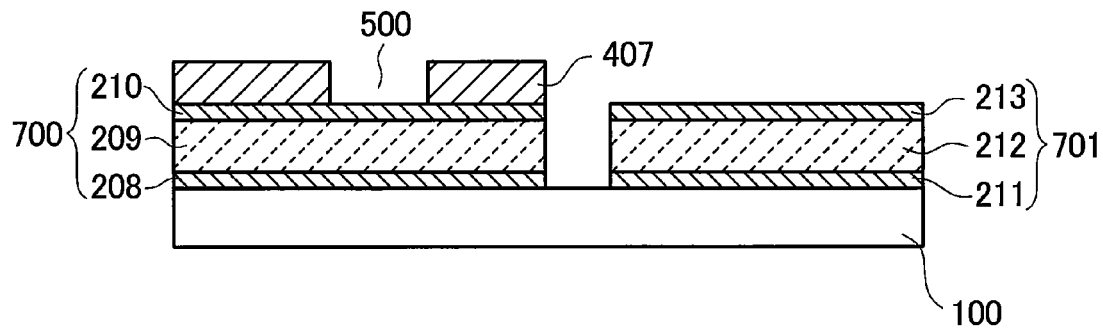
FIG. 16A is a cross sectional schematic view for a main portion of a manufacturing step of a semiconductor device according to a fifth embodiment of the present invention.

After forming titanium nitride of 50 nm film thickness, aluminum of 400 nm film thickness, and titanium nitride of 50 nm film thickness above a substrate 100 formed with a semiconductor device, a silicon nitride film of 100 nm thickness was formed by using a CVD method. Then, after leaving the silicon nitride film only in a desired region by using a lithographic method and a dry etching method, a first metal interconnect 700 comprising a first barrier metal layer 208, a first aluminum layer 209, and a second barrier metal 210, and a second metal interconnect 701 comprising a third barrier metal 211, a second aluminum layer 212, and a fourth barrier metal 213 were formed by using the lithographic method and the dry etching method again. In this embodiment, an etch stop film 407 comprising silicon nitride of 100 nm film thickness having a first opening 500 was formed above the first metal interconnect 700. The planar shape of the first opening 500 is a square shape of 1 µm side length (FIG. 16A).

Figure 16B:
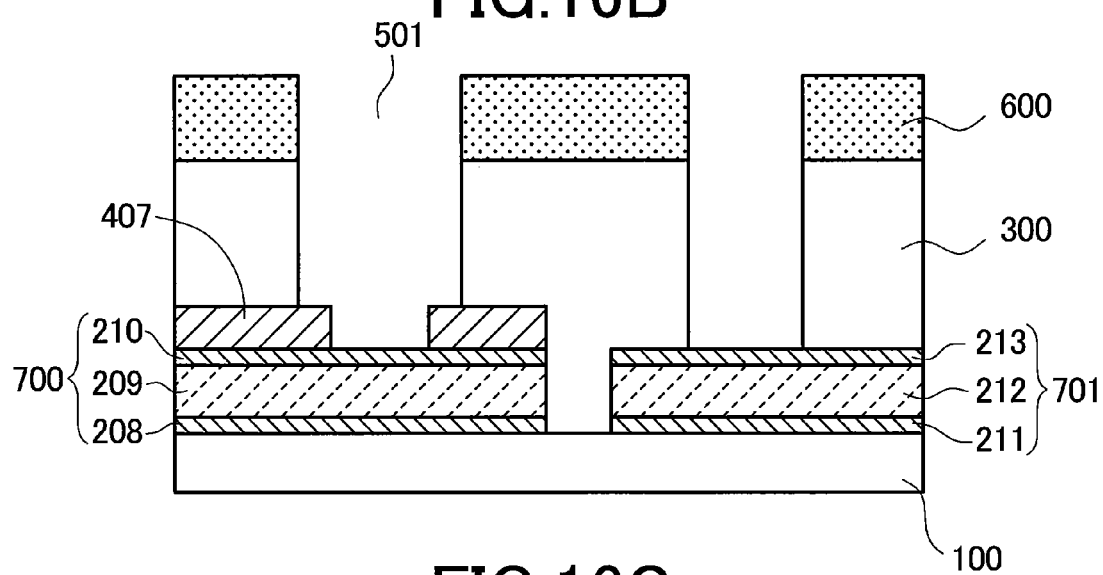
FIG. 16B is a cross sectional schematic view for a main portion of a manufacturing step of a semiconductor device according to the fifth embodiment of the present invention.

Then, after forming a silicon oxide film of 2 µm thickness by using a plasma CVD method as a first interlayer dielectric film 300, improving the planarity of the first interlayer dielectric film 300 by using a chemical mechanical polishing method, and after forming a fabrication resist 600 comprising a photosensitive organic polymer film by using a lithographic method, a second opening 501 was formed to the first interlayer dielectric film 300 so as to include, on the inside, the first opening 500 formed in the etch stop film 407 disposed above the first metal interconnect 700 by using a dry etching method, to expose the surface of the first metal interconnect 700. The step formed by the etch stop film 407 corresponds to the height of the step in the first embodiment (FIG. 16B).

Figure 16C:
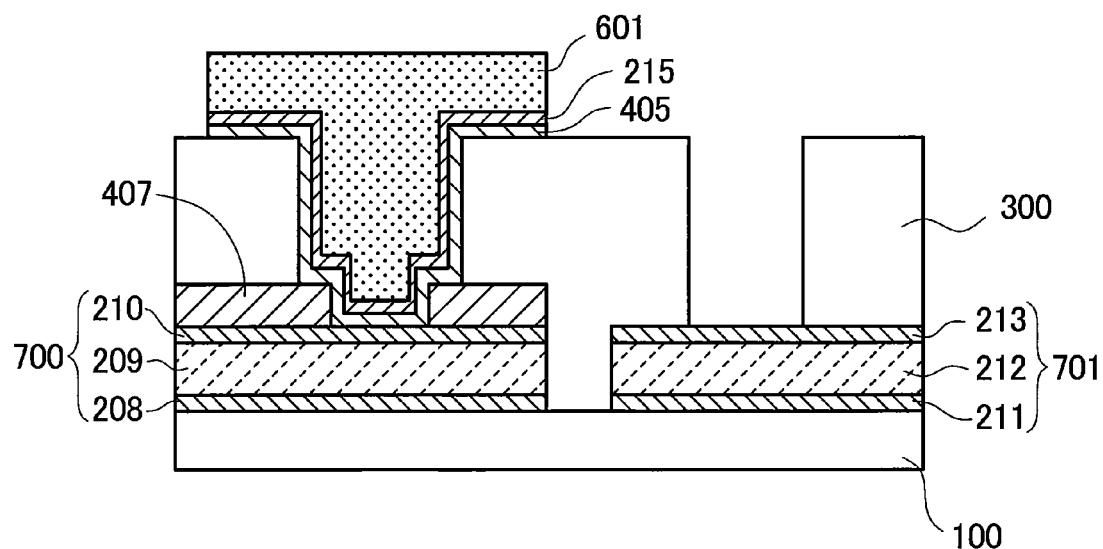
FIG. 16C is a cross sectional schematic view for a main portion of a manufacturing step of a semiconductor device according to the fifth embodiment of the present invention.

Then, after removing the first fabrication resist 600, and after forming hafnium oxide of 15 nm film thickness by an ALD method and titanium nitride of 50 nm film thickness by a CVD method, a second fabrication resist 601 comprising a photosensitive organic polymer film was formed so as to cover a region intended to serve as a capacitor by using a lithographic method. Then, an unnecessary portion of the upper electrode film and the capacitance film was removed by using the second fabrication resist 601 as an etching mask to form a fabricated upper electrode 215 and a fabricated capacitance film 405 (FIG. 16C).

Figure 17A:
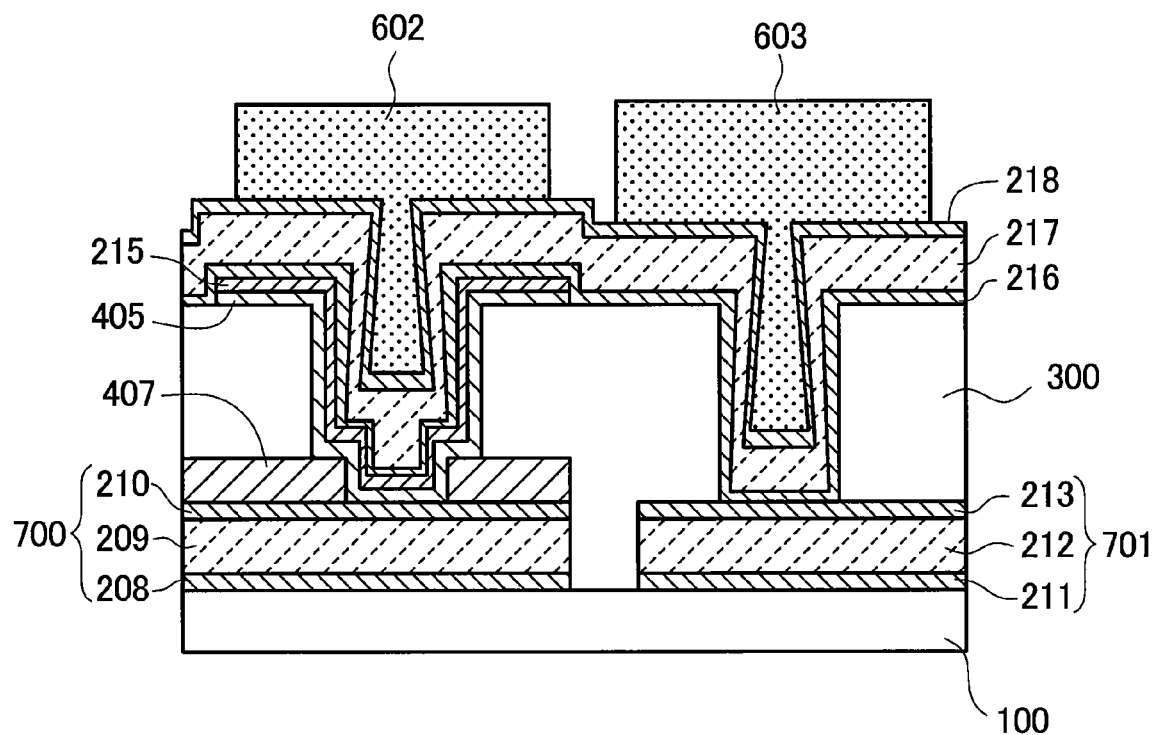
FIG. 17A is a cross sectional schematic view for a main portion of a manufacturing step of a semiconductor device according to the fifth embodiment of the present invention.

Then, after removing the second fabrication resist 601, a first barrier metal film 216 comprising titanium nitride of 50 nm thickness, a first aluminum film comprising aluminum of 400 nm thickness, and a second barrier metal film 218 comprising titanium nitride of 50 nm thickness were formed by using sputtering method, and a third fabrication resist 602 and a fourth fabrication resist 603 comprising a photosensitive organic polymer film are formed so as to cover a portion intended to be left as an interconnect by using a lithographic method (FIG. 17A).

Figure 17B:
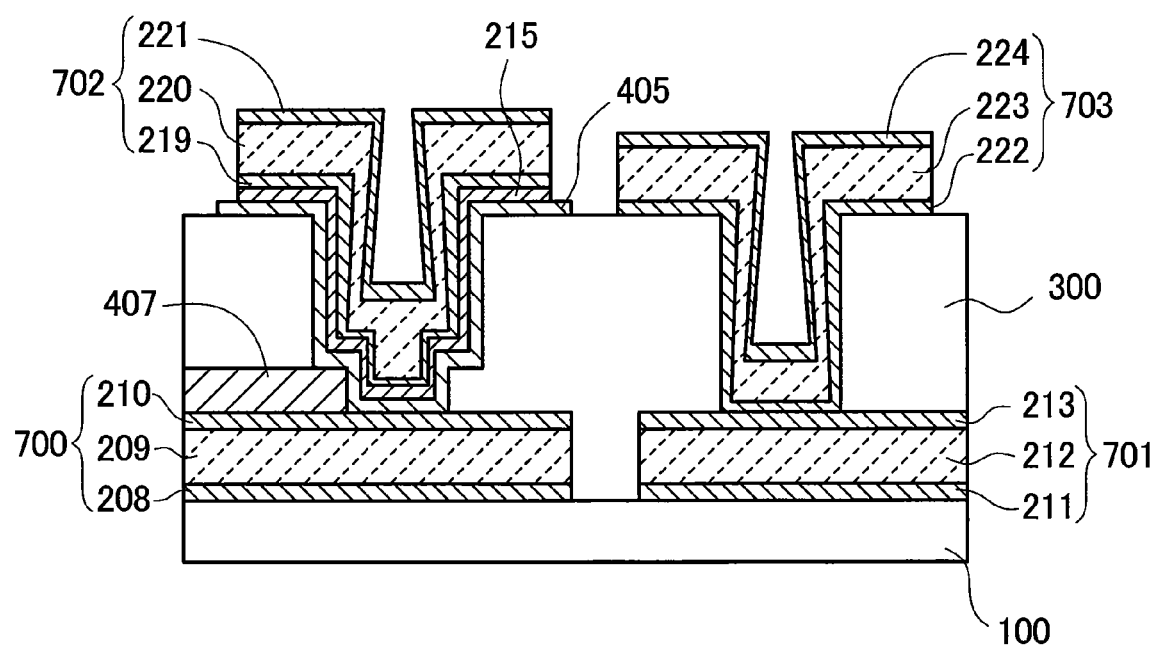
FIG. 17B is a cross sectional schematic view for a main portion of a manufacturing step of a semiconductor device according to the fifth embodiment of the present invention.

Then, it is possible to form a semiconductor device having an MIM capacitor constituted with a first metal interconnect 700, a fabricated capacitance film 405, a fabricated upper electrode 215, and a third metal interconnect 702, and a multilevel interconnect constituted with a second metal interconnect 701 and a fourth metal interconnect 703 as shown in FIG. 17B by conducting dry etching using third and fourth fabrication resists as the fabrication mask. In the fifth embodiment, while the planar layout as shown in the first embodiment is not illustrated, it is basically according to the layout shown in FIG. 6. However, the portion laid out as the first opening 755 in FIG. 6 corresponds to the first opening 500 formed in the etch stop film 407.

As a result of examining the performance and the reliability of the MIM capacitor in the semiconductor device having the thus formed MIM capacitor, capacitance density, breakdown field strength and leakage current substantially same as those shown in the first embodiment were obtained and substantially the same effect was obtained also for the variation of each of the performances.

That is, it is possible to form a semiconductor device having an MIM capacitor capable of making high capacitance density and high capacitance accuracy compatible while having a high reliability in accordance with the embodiment of the invention, by forming an etch stop layer having a first opening in a desired region above the first metal interconnect, then forming an interlayer dielectric film comprising silicon oxide so as to cover them, forming a second opening to the interlayer dielectric film in a region corresponding to the via hole layer of the interlayer dielectric film just above the first metal interconnect so as to include the first opening formed to the etch stop layer formed above the first metal interconnect, thereby exposing the surface of the first metal interconnect, then forming a capacitance film and a third metal interconnect, thereby forming an MIM capacitor constituted with the first metal interconnect, the capacitance film, and the third metal interconnect.

In this embodiment, different from the first embodiment, an etch stop layer previously formed with a region corresponding to the opening of the MIM capacitor is disposed above the first metal interconnect. By keeping the etching rate for the etch stop layer to a level lower than that of the etching rate for the interlayer dielectric film, the first opening formed to the etch stop layer can be kept substantially in the shape as it is even when etching is conducted till the surface of the first metal interconnect is exposed upon opening the via hole of the interlayer dielectric film. While the height of the step was controlled by the etching time of the interlayer dielectric film in the first embodiment, since the thickness of the etch stop layer constitutes the height of the step as it is in this embodiment, it has a merit capable of improving the controllability for the height of the step although there is a problem that the number of steps increases compared with the first embodiment. Further, since the step is not formed to the region utilized as a via hole, it also has a merit that the via hole resistance is decreased.

In this embodiment, while the thickness of the etch stop layer corresponding to the height of the step was defined to 100 nm, the height of the step can be changed optionally by changing the film thickness. With the reason described for the first embodiment, the height of the step is preferably within a range from 50 nm to 300 nm.

Further, while the first metal interconnect and the second metal interconnect were fabricated after forming the etch stop layer in this embodiment, it is possible to replace the sequence and dispose the etch stop layer after forming the first metal interconnect and the second metal interconnect, and form the first opening to the etch stop layer.

Further, while the first opening and the second opening are laid out such that the centers thereof are aligned and the edge of the first opening is laid out at a position apart by 100 nm from the edge of the second opening, the layout can be changed optionally. With the reason as described for the first embodiment, it is desirable to narrow the edge gap within a range of the aligning margin in the lithographic step and it is not always necessary that the centers for the respective openings are aligned.

Further, while the planar shape for the first opening and the second opening is made square, the usefulness of this embodiment is not restricted thereto. In addition to the square shape, a rectangular shape, a circular shape, an elliptic shape, a trigonal shape, a rhombic shape, or a combined shape may also be used.

Further, in this embodiment, while only one second opening is formed in the first opening, a plurality of openings may be formed optionally.

Further, while silicon nitride formed by using the plasma CVD method was used as the etch stop layer in this embodiment, they are not restricted to the film deposition method and the material but any dielectric material can be utilized so long as it functions as the etch stop layer upon etching of the interlayer dielectric film. As other materials than silicon nitride, dielectric materials such as silicon oxide, silicon carbide, aluminum oxide, aluminum nitride, and boron nitride can also be used. Further, for the etch stop layer, a plurality of dielectric films may optionally be stacked and used.

In this embodiment, while formation of the opening in the MIM capacitor region and formation of the opening in the via hole portion are conducted simultaneously, they can be conducted as separate steps as shown in the second embodiment. Although the number of steps increases by adopting the separate steps, since it is not necessary to remove the capacitance film or the upper electrode film in the inside of the via hole, this also provides an advantage capable of improving the conduction yield easily.

In this embodiment, while hafnium oxide of 15 nm film thickness was used for the capacitance film, the film thickness and the material are not restricted to them. Further, as the material for the capacitance film, in addition to the hafnium oxide, silicon oxide, silicon nitride, tantalum oxide, zirconium oxide, lanthanum oxide, titanium oxide, or aluminum oxide, as well as a mixture thereof and a compound incorporated with nitrogen can also be used. Further, a ferrodielectric material such as PZT, STO, and BST can also be used. Further, the capacitance film may optionally be in a stacked structure.

Further, in this embodiment, while titanium nitride of 50 nm film thickness formed by the CVD method is used for formation of the upper electrode, other film thicknesses, materials and film deposition methods than those described above can also be used. As other materials than titanium nitride, metals including tungsten, molybdenum, tantalum, and nitrides thereof as the main component can also be used.

Further, in this embodiment, while titanium nitride is used as the barrier metal for the first, second, third, and fourth metal interconnects, metals such as tantalum, tungsten, and nitrides thereof as the main component can also be used in addition to titanium nitride. Further, a structure not using the barrier metal can also be utilized so long as there is a margin in view of the reliability. Further, a stacked structure comprising a plurality of layers can be used both for the upper electrode and the barrier metal with no particular problems.

Further, in this embodiment, while the opening formed in the first interlayer dielectric film is filled with a stacked film of the barrier metal and aluminum formed by the sputtering method, the opening can also be filled with other materials and by other forming methods. A method of filling tungsten formed by a CVD method is well-known, and the metal can be filled reliably by using the method even in an opening which is small and deep in the opening size.

Further, while description has been made in this embodiment to a step of using the silicon oxide film mainly as the first interlayer dielectric film as an example, the film is not restricted to the material but it is also possible to use a Low-k material capable of decreasing the coupling capacitance of the interconnect. As the Low-k material, an SiOC film, organic polymer film, or Low-k material introducing pores to them, fluorine-containing silicon oxide film, etc., can also be used.

Sixth Embodiment

FIG. 18 and FIG. 19 are cross sectional views showing manufacturing steps of a semiconductor device according to the sixth embodiment of invention. Description is to be made successively.

Figure 18A:
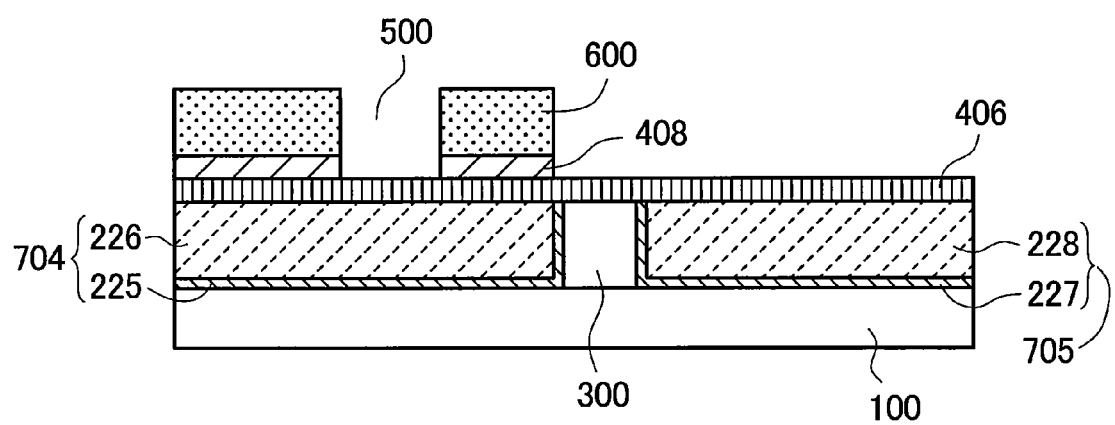
FIG. 18A is a cross sectional schematic view for a main portion of a manufacturing step of a semiconductor device according to a sixth embodiment of the present invention.

As shown in FIG. 18A, a silicon oxide film of 500 nm thickness was formed on a substrate 100 formed with a semiconductor device by using a plasma CVD method to form a first interlayer dielectric film 300. Then, a photosensitive organic polymer film was formed so as to have an opening in a region intended to form an interconnect, and a desired region of the first interlayer dielectric film 300 was removed by a dry etching method using the film as a fabrication mask. Then, after forming tantalum of 50 nm film thickness and a copper film of 100 nm thickness by a sputtering method, and after growing the copper film further by an electroplating method, excessive tantalum film and copper film on the first interlayer dielectric film 300 were removed by using a chemical-mechanical polishing method to form a fifth metal interconnect 704 comprising a first adhesive layer 225 comprising tantalum of 50 nm film thickness and a first copper layer 226 comprising a copper film of 450 nm thickness, and a sixth metal interconnect 705 comprising a second adhesive layer 227 comprising tantalum of 50 nm film thickness, and a second copper layer 228 comprising a copper film of 450 nm thickness. Then, a barrier dielectric film 406 comprising silicon nitride of 50 nm film thickness formed by a plasma CVD method and a second etch stop layer 408 comprising silicon nitride of 50 nm film thickness formed by a plasma CVD method were formed successively. Then, a second etch stop layer was fabricated so as to have an opening 500 above the fifth metal interconnect 704 by the combination of a lithographic method and a dry etching method. In this case, the second etch stop layer is not left in a region to be formed with a via hole above the sixth metal interconnect 705 not forming the MIM capacitor. The planar shape of the first opening 500 was a square shape of 1 μm side length.

Figure 18B:
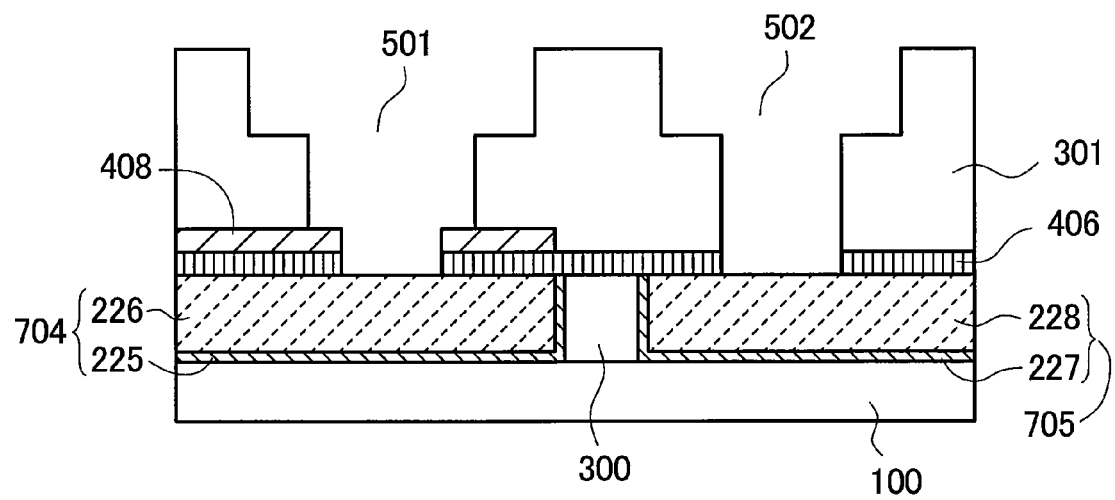
FIG. 18B is a cross sectional schematic view for a main portion of a manufacturing step of a semiconductor device according to the sixth embodiment of the present invention.

Then, as shown in FIG. 18B, after forming a second interlayer dielectric film 301 comprising silicon oxide of 1.5 μm film thickness successively by using a plasma CVD method, a second opening 501 and a third opening 502 corresponding to a via hole and an interconnect trench were formed by using a trench-first dual damascene process. Specifically, after forming a photosensitive organic polymer film so as to have an opening in a region intended to be used as a second interlayer dielectric film, the second interlayer dielectric film was etched by a depth of 500 nm being assumed as the height for the interconnect by using a dry etching method to form an interconnect trench. Then, after removing the photosensitive organic polymer film, a photosensitive organic polymer film was formed so as to have an opening in a region intended to be formed with a via hole. Then, the second interlayer dielectric film 301 was dry etched using the photosensitive organic polymer film as a fabrication mask to expose the surface of the fifth metal interconnect 704 and the sixth metal interconnect 705. In this step, the planar shape of the via hole opened above the fifth metal interconnect 704 was in a square shape of 1.2 µm side length and it was adapted so as to include the opening 500 disposed to the second etch stop layer 408. Further, since the etching condition was set such that the etching rate for the second interlayer dielectric film 301 comprising silicon oxide was higher than the etching rate for the silicon carbide constituting the second etch stop layer 4, second interlayer dielectric film 301 comprising silicon, a step is formed in a region corresponding to the via hole above the fifth metal interconnect 704. The step formed with the second etch stop layer 408 and the barrier dielectric film 406 corresponds to the height of the step in the first embodiment. In this embodiment, since the film thickness was 50 nm both for the second etch stop layer 408 and the barrier dielectric film 406, the height for the step is 100 nm.

Figure 19A:
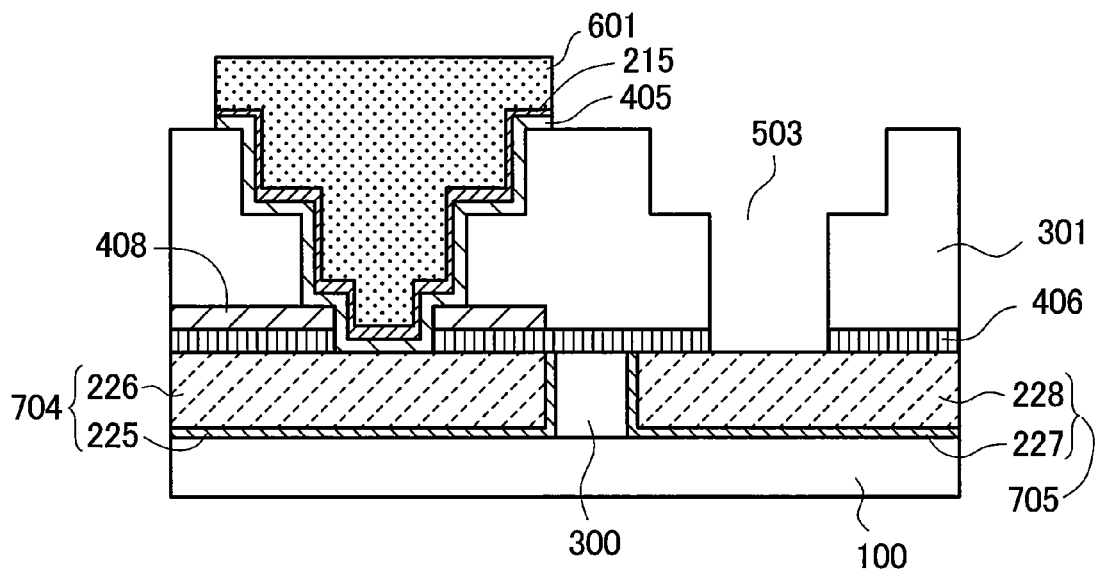
FIG. 19A is a cross sectional schematic view for a main portion of a manufacturing step of a semiconductor device according to the sixth embodiment of the present invention.

Then as shown in FIG. 19A, after forming hafnium oxide of 15 nm film thickness formed by an ALD method and titanium nitride of 50 nm film thickness formed by a CVD method, a second fabrication resist 601 comprising a photosensitive organic polymer film was formed so as to cover a region intended to serve as a capacitor by using a lithographic method. Then, an unnecessary portion of hafnium oxide and titanium nitride was removed by using the second fabrication resist 601 as an etching mask and a fabricated upper electrode 215 comprising titanium nitride of 50 nm film thickness and a fabricated capacitance film 405 comprising hafnium oxide of 15 nm film thickness were formed.

Figure 19B:
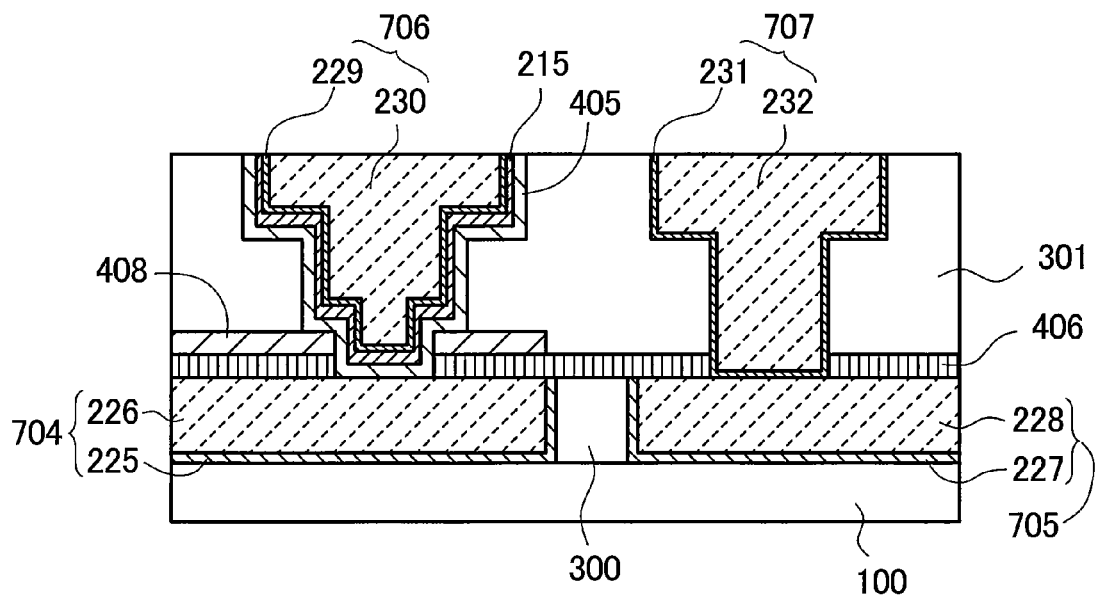
FIG. 19B is a cross sectional schematic view for a main portion of a manufacturing step of a semiconductor device according to the sixth embodiment of the present invention.

Then as shown in FIG. 19B, after removing the second fabrication resist 601 and then forming tantalum of 50 nm film thickness and a copper film of 100 nm thickness by a sputtering method and after growing the copper film further by an electroplating method, excess tantalum film and copper film above the second interlayer dielectric film 301 were removed by using a chemical-mechanical polishing method to form a seventh metal interconnect 706 comprising a third adhesive layer 229 comprising tantalum of 50 nm film thickness and a third copper layer 230 comprising a copper film of 450 nm thickness, and an eighth metal interconnect 707 comprising a fourth adhesive layer 231 comprising tantalum of 50 nm film thickness and a fourth copper layer 232 comprising a copper film of 50 nm thickness were formed. As described above, it is possible to form a semiconductor device having an MIM capacitor comprising a fifth metal interconnect 704, the fabricated capacitance film 405, the fabricated upper electrode 215, and a seventh metal interconnect 706. In the sixth embodiment, a planar layout as shown in the third embodiment is not illustrated but this is basically according to the layout shown in FIG. 13. However, the portion laid out as the first opening 755 corresponds to the first opening 500 formed in the second etch stop layer 408.

As a result of examining the performance and the reliability of the MIM capacitor in the semiconductor device having the thus formed MIM capacitor, capacitance density, breakdown field strength and leakage current substantially same as those shown in the first embodiment were obtained and substantially the same effect was obtained also for the variation of each of the performances.

That is, it is possible to form a semiconductor device having an MIM capacitor capable of making high capacitance density and high capacitance accuracy compatible while having a high reliability in accordance with the embodiment of the invention, by forming a second etch stop layer having a first opening in a desired region above the fifth metal interconnect, then forming a second interlayer dielectric film comprising silicon oxide so as to cover them, forming a second opening to the interlayer dielectric film in a region corresponding to the via hole layer of the interlayer dielectric film just above the first metal interconnect so as to include the first opening formed to the second etch stop layer formed above the fifth metal interconnect, thereby exposing the surface of the fifth metal interconnect, then forming a capacitance film and a seventh metal interconnect, thereby forming an MIM capacitor constituted with the fifth metal interconnect, the capacitance film, and the seventh metal interconnect.

In this embodiment, different from the third embodiment, a second etch stop layer previously formed with a region corresponding to the opening of the MIM capacitor is disposed above the fifth metal interconnect. By keeping the etching rate for the second etch stop layer to a level lower than the etching rate for the second interlayer dielectric film, the first opening formed to the second etch stop layer can be kept substantially in the shape as it is even when etching is conducted till the surface of the fifth metal interconnect is exposed upon opening the via hole of the second interlayer dielectric film. While the height of the step was controlled by the etching time of the interlayer dielectric film in the third embodiment, since the thickness of the second etch stop layer and the barrier dielectric film constitutes the height of the step as it is in this embodiment, it has a merit capable of improving the controllability for the height of the step although there is a problem that the number of steps increases compared with the third embodiment. Further, since the step is not formed to the region utilized as a via hole, it also has a merit that the via hole resistance is decreased.

In this embodiment, since the thicknesses for each of the second etch film and the barrier dielectric film are 50 nm, the height of the step is 100 nm. The height for the step can be changed optionally. With the reasons described for the first embodiment, since the height for the step is preferably within a range from 50 nm to 300 nm, the total thickness is preferably within the range described above. The minimum thickness of the second etch stop layer is defined by an etching selection ratio relative to the second interlayer dielectric film. Further, the thickness of the barrier dielectric film is defined by the barrier property of the barrier dielectric film. In this embodiment, while the second etch stop layer and the barrier dielectric film were formed of different materials, they may be formed of an identical material. In this case, upon forming the first opening 500, it is preferred to control etching so as not to expose the surface of the fifth metal interconnect 704 in view of the reliability.

Further, while the first opening and the second opening are laid out such that the centers thereof are aligned and the edge of the first opening is laid out at a position apart by 100 nm from the edge of the second opening, the layout can be changed optionally. With the reason as described for the first embodiment, it is desirable to narrow the edge gap within a range of the aligning margin in the lithographic step and it is not always necessary that the centers for the respective openings are aligned.

Further, while the planar shape for the first opening and the second opening is made square in this embodiment, the usefulness of this embodiment is not restricted thereto. In addition to the square shape, a rectangular shape, a circular shape, an elliptic shape, a trigonal shape, a rhombic shape, or a combined shape may also be used.

Further, in this embodiment, while only one second opening is formed in the first opening, a plurality of openings may be formed optionally.

Further, in this embodiment, while only one second opening is formed in the first opening, a plurality of openings may be formed optionally.

Further, in this embodiment, while silicon carbide formed by using the plasma CVD method was used as the second etch stop layer, the film deposition method and the material are not restrictive but any dielectric material that functions as the etch stop layer can be utilized upon etching the second interlayer dielectric film. As the material other than silicon carbide, dielectric materials such as silicon oxide, silicon nitride, aluminum oxide, aluminum nitride, and boron nitride can also be used. Further, a plurality of dielectric films can optionally be used in stack for the etch stop layer.

In this embodiment, while hafnium oxide of 15 nm film thickness was used for the capacitance film, the film thickness and the material are not restrictive. As the material for the capacitance film, in addition to the hafnium oxide, silicon oxide, silicon nitride, tantalum oxide, zirconium oxide, lanthanum oxide, titanium oxide, or aluminum oxide, as well as a mixture thereof and compounds incorporated with nitrogen to them can also be used. Further, a ferrodielectric material such as PZT, STO, and BST can also be used. Further, the capacitance film may be optionally in a stacked structure.

Further, in this embodiment, while titanium nitride of 50 nm film thickness formed by the CVD method is used for formation of the upper electrode, other film thicknesses, materials and film deposition methods than those described above can also be used. As other materials than titanium nitride, metals including tungsten, molybdenum, tantalum, and nitrides thereof as the main component can also be used.

Further, while the fifth, sixth, seventh, and eighth metal interconnects are formed by the combination of tantalum and copper, other materials may also be used. In addition to tantalum, those metals comprising titanium, tungsten, molybdenum, and nitrides thereof as the main component can also be used and a metal layer in a stacked structure can also be used optionally. Further, instead of the copper film, aluminum, tungsten, titanium, and alloys and compounds thereof can also be used.

Further, in this embodiment, while the capacitance film was formed directly to the surface of the fifth metal interconnect, the surface of the copper film may optionally be covered with other conductor materials. For example, the metal can also be grown selectively only on the surface of the copper film exposed to the surface of the fifth metal interconnect by using a selective CVD method or an electroless plating method. By using the method, a sufficient reliability can be maintained also in a case of using a capacitance film material in which copper is diffused easily.

Further, while the trench-first dual damascene method was used as the fabrication method for the seventh and eighth metal interconnects in this embodiment, the effectiveness of the method is not restricted thereto. The same effect can also be expected by other dual damascene methods and a single damascene method of forming the interconnect trench and the via hole independently. In a case of the single damascene method, it is effective to apply the embodiment of the invention to the via hole forming process.

Further, while description has been made in this embodiment to a step of using the silicon oxide film mainly as the first and second interlayer dielectric films as an example, the film is not restricted to the material but it is also possible to use a Low-k material capable of decreasing the coupling capacitance of the interconnect. As the Low-k material, an SiOC film, organic polymer film, or Low-k material introducing pores to them, fluorine-containing silicon oxide film, etc can also be used.

Seventh Embodiment

FIG. 20 and FIG. 21 are cross sectional views showing the manufacturing step of a semiconductor device according to a seventh embodiment of the invention. They are to be described successively.

Figure 20A:
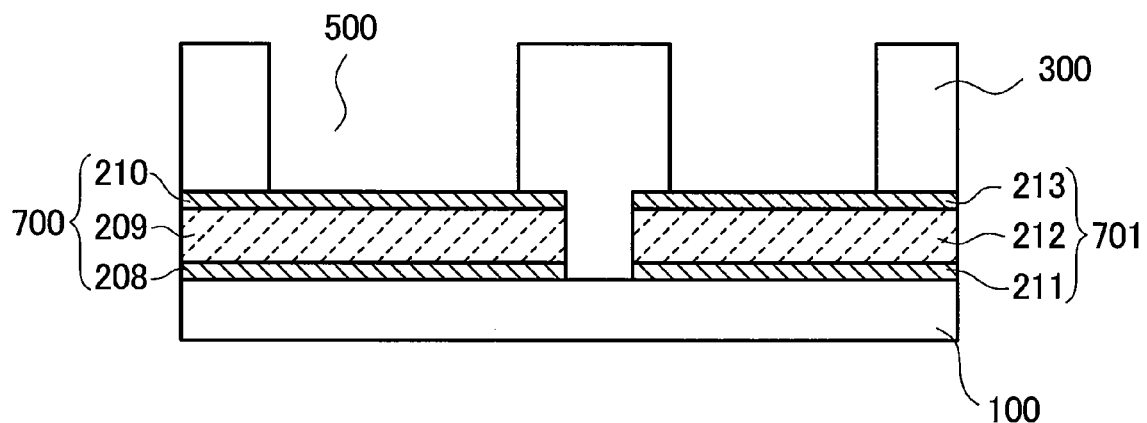
FIG. 20A is a cross sectional schematic view for a main portion of a manufacturing step of a semiconductor device according to a seventh embodiment of the present invention.

After forming titanium nitride of 50 nm film thickness, aluminum of 400 nm film thickness, and titanium nitride of 50 nm film thickness by using a sputtering method above a substrate 100 formed with a semiconductor device, a first metal interconnect 700 comprising a first barrier metal layer 208, a first aluminum layer 209, and a second barrier metal layer 210, and a second metal interconnect 701 comprising a third barrier metal layer 211, a second aluminum layer 212, and a fourth barrier metal layer 213 were formed by using a lithographic method and a dry etching method. Then, a silicon oxide film of 2 μm thickness was formed by using a plasma CVD method as a first interlayer dielectric film 300. Then after improving the planarity of the first interlayer dielectric film by using a chemical mechanical polishing method, a first opening 500 was formed in a desired region of the first interlayer dielectric film 300 so as to expose the first metal interconnect 700 and the second metal interconnect 701 by using a lithographic method and a dry etching method. In this case, the planar shape of the first opening 500 disposed to the first interlayer dielectric film 300 was a square shape of 1.4 μm side length (FIG. 20A).

Then, after forming a spacer film 409 comprising silicon oxide of 100 nm film thickness so as to cover the first opening 500 by using a plasma CVD method, a first fabrication resist 600 comprising a photosensitive organic polymer film having an opening in the inside of the opening described above was formed by using a lithographic method. Then, a second opening 501 was formed to the spacer film 409 so as to expose the first metal interconnect 700 by using a dry etching method.

Figure 20B:
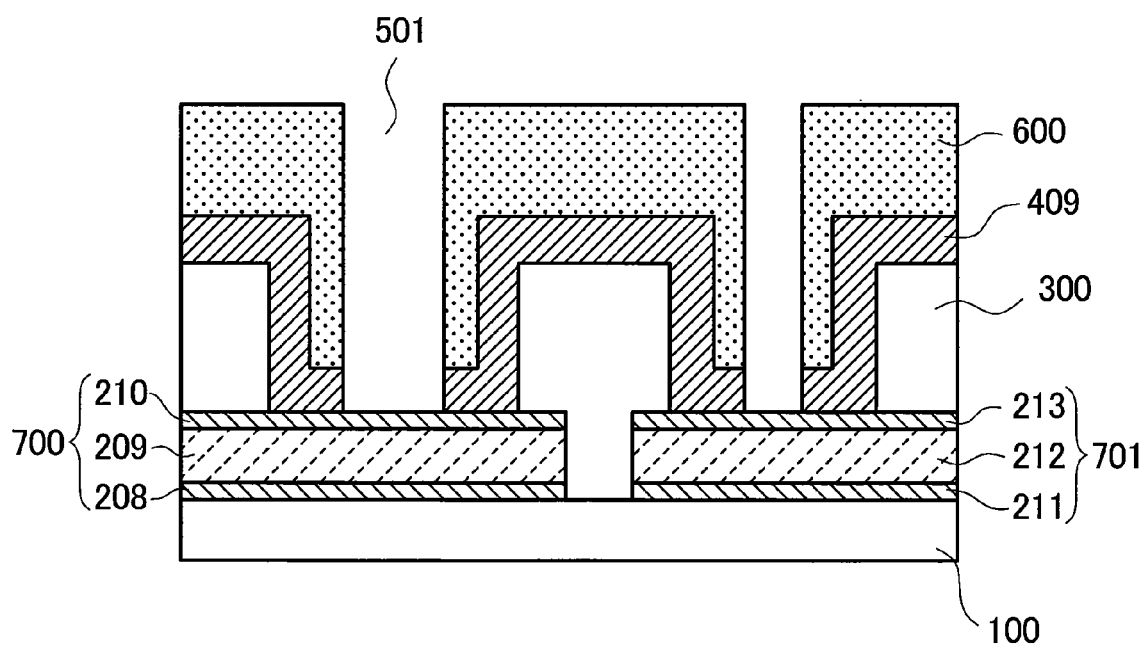
FIG. 20B is a cross sectional schematic view for a main portion of a manufacturing step of a semiconductor device according to the seventh embodiment of the present invention.

The second opening 501 formed to the spacer film 409 was a square shape of 1 μm side length and formed so as to be included completely in the inside of the first opening 500. Accordingly, a step due to the spacer film 409 is formed in the inside of the first opening 500 formed in the first interlayer dielectric film 300, and a step of 100 nm corresponds to the thickness of the spacer film 409 is formed to the upper surface of the first metal interconnect 700. The step caused in this case corresponds to the height of the step in the first embodiment (FIG. 20B).

Figure 21A:
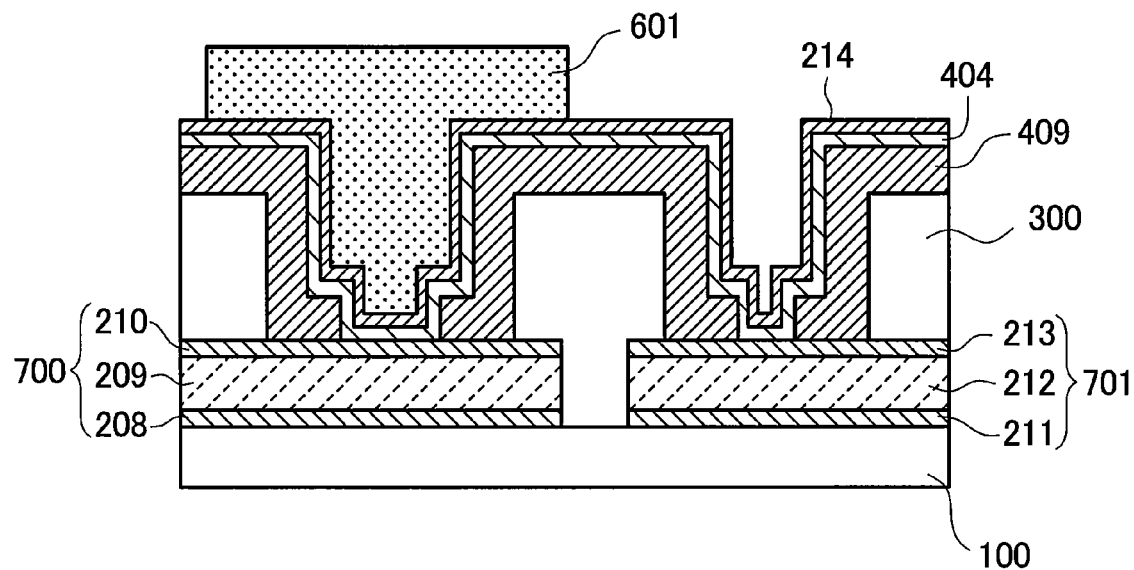
FIG. 21A is a cross sectional schematic view for a main portion of a manufacturing step of a semiconductor device according to the seventh embodiment of the present invention.

Then, after removing the first fabrication resist 600, a capacitance film 404 comprising hafnium oxide of 15 nm thickness formed by an ALD method and an upper electrode film 214 comprising titanium nitride of 50 nm thickness formed by a CVD method were formed successively. Then, a second fabrication resist 601 comprising a photosensitive organic polymer film was formed so as to cover a region intended to serve as a capacitor was formed by using a lithographic method (FIG. 21A).

Figure 21B:
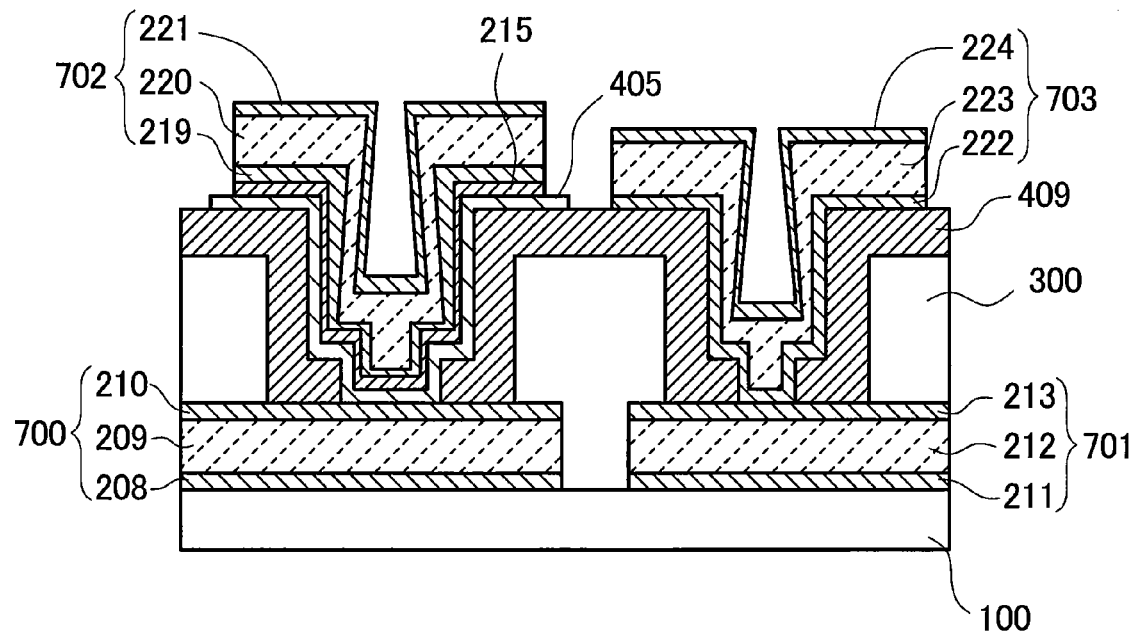
FIG. 21B is a cross sectional schematic view for a main portion of a manufacturing step of a semiconductor device according to the seventh embodiment of the present invention.

Then, after removing an unnecessary portion of the upper electrode film 214 and the capacitance film 404 by using the second fabrication resist 601 as an etching mask, and after forming a fabricated upper electrode 215 and a fabricated capacitance film 405, the second fabrication resist 601 was removed. Then, titanium nitride of 50 nm film thickness, aluminum of 400 nm film thickness, and titanium nitride of 50 nm film thickness were formed by using a sputtering method, and a photosensitive organic polymer film was formed so as to cover a portion intended to be left as an interconnect by using a lithographic method. Then, it is possible to form a semiconductor device having an MIM capacitor constituted with the first metal interconnect 700, the fabricated capacitance film 405, the fabricated upper electrode 215 and a third metal interconnect 702, and a multi-level interconnect constituted with the second metal interconnect 701 and a fourth metal interconnect 703 by conducting dry etching using the photosensitive organic polymer film as a fabrication mask (FIG. 21B). In the seventh embodiment, the planar layout as shown in the first embodiment is not illustrated but this is basically according to the layout shown in FIG. 6. However, the sizes of the first opening 755 and the second opening 756 are different from those of the first embodiment.

As a result of examining the performance and the reliability of the MIM capacitor in the semiconductor device having the thus formed MIM capacitor, capacitance density, breakdown field strength and leakage current substantially same as those shown in the first embodiment were obtained and substantially the same effect was obtained also for the variation of each of the performances.

That is, it is possible to form a semiconductor device having an MIM capacitor capable of making high capacitance density and high capacitance accuracy compatible while having a high reliability in accordance with the embodiment of the invention, by forming an interlayer dielectric film comprising silicon oxide so as to cover the first metal interconnect, then forming a first opening to the interlayer dielectric film in a region corresponding to the via hole layer of the interlayer dielectric film just above the first metal interconnect so as to expose the upper surface of the first metal interconnect, then forming the spacer film so as to cover the first opening, forming the second opening to the spacer film so as to be included in the first opening, and then forming the capacitance film and the third metal interconnect to form an MIM capacitor constituted with the first metal interconnect, the capacitance film, and the third metal interconnect.

In this embodiment, different from the first embodiment, after forming the first opening in a state of exposing the first metal interconnect to the MIM capacitor portion, the spacer film having the second opening is formed. Since the height of the step can be controlled by the thickness of the spacer film, it has an advantage capable of improving the controllability for the height of the step easily compared with the first embodiment. However, since the opening of the first opening formed to the interlayer dielectric film decreases in accordance with the thickness of the spacer film, the resistance increases more compared with the method of first embodiment.

In this embodiment, while the height of the step is 100 nm since the thickness of the spacer film was defined as 100 nm, the height of the step can optionally be changed. With the reason described for the first embodiment, the height of the sep is preferably within a range from 50 nm to 300 nm.

Further, while the first opening and the second opening are laid out such that the centers thereof are aligned and the edge of the first opening is laid out at a position apart by 200 nm from the edge of the second opening, the layout can be changed optionally. With the reason as described for the first embodiment, it is desirable to narrow the edge gap within a range of the aligning margin in the lithographic step and it is not always necessary that the centers for the respective openings are aligned.

Further, in this embodiment, while silicon oxide formed by using the plasma CVD method was used as the spacer film, the film deposition method and the material are not restrictive. As other materials, dielectric materials such as silicon carbide, silicon nitride, aluminum oxide, aluminum nitride, boron nitride, and Low-k material can also be used.

Further, in the embodiment while the planar shape for the first opening and the second opening is made square, the usefulness of this embodiment is not restricted thereto. In addition to the square shape, a rectangular shape, a circular shape, an elliptic shape, a trigonal shape, a rhombic shape, or a combined shape may also be used.

Further, in this embodiment, while only one second opening is formed in the first opening, a plurality of openings may be formed optionally.

Further, in this embodiment, while the MIM capacitor region and the via hole region used as the interconnect are opened simultaneously, they can also be formed separately by using the step shown in the second embodiment.

In this embodiment, while hafnium oxide of 15 nm film thickness was used for the capacitance film, the film thickness and the material are not restrictive. As the material for the capacitance film, in addition to the hafnium oxide, silicon oxide, silicon nitride, tantalum oxide, zirconium oxide, lanthanum oxide, titanium oxide, or aluminum oxide, as well as a mixture thereof and a compound incorporated with nitrogen can also be used. Further, a ferrodielectric material such as PZT, STO, and BST can also be used. Further, the capacitance film may optionally be in a stacked structure.

Further, in this embodiment, while titanium nitride of 50 nm film thickness formed by the CVD method is used for formation of the upper electrode, other film thicknesses, materials, and film deposition methods than those described above can also be used. As other materials than titanium nitride, metals including tungsten, molybdenum, tantalum, and nitrides thereof as the main component can also be used.

Further, in this embodiment, while titanium nitride is used as the barrier metal for the first, second, third, and fourth metal interconnects, metals such as tantalum, tungsten, and nitrides thereof as the main component can also be used in addition to titanium nitride. Further, a structure not using the barrier metal can also be utilized so long as there is a margin in view of the reliability. Further, a stacked structure comprising a plurality of layers can be used both for the upper electrode and the barrier metal with no particular problems.

Further, in this embodiment, while the opening formed in the first interlayer dielectric film is filled with a stacked film of the barrier metal and aluminum formed by the sputtering method, the opening can also be filled with other materials and by other forming methods. A method of filling tungsten formed by a CVD method is well-known, and the metal can be filled reliably by using the method even in an opening which is small and deep in the opening size.

Further, while description has been made in this embodiment to a step of using the silicon oxide film mainly as the first interlayer dielectric film as an example, the film is not restricted to the material but it is also possible to use a Low-k material capable of decreasing the coupling capacitance of the interconnect. As the Low-k material, an SiOC film, organic polymer film, or Low-k material introducing pores to them, fluorine-containing silicon oxide film, etc can also be used.

Eighth Embodiment

FIG. 22 and FIG. 23 are cross sectional views showing a manufacturing step of a semiconductor device according to the invention. Description is to be made successively.

Figure 22A:
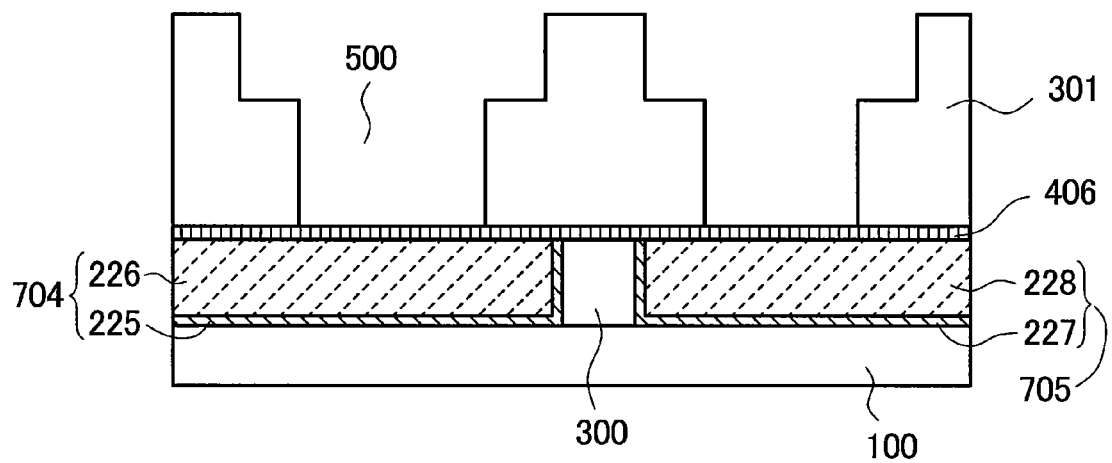
FIG. 22A is a cross sectional schematic view for a main portion of a manufacturing step of a semiconductor device according to an eighth embodiment of the present invention.

According to the step shown in the third embodiment, a first interlayer dielectric film 300 comprising a silicon oxide film of 500 nm thickness, a fifth metal interconnect 704 comprising a first adhesive layer 225 comprising tantalum of 50 nm thickness, and a first copper layer 226 comprising a copper film of 450 nm thickness, and a sixth metal interconnect 705 comprising a second adhesive layer 227 comprising copper of 50 nm thickness and a second copper layer 228 comprising a copper film of 450 nm thickness were formed by a plasma CVD method on a substrate 100 formed with a semiconductor device. Then, after forming a barrier dielectric film 406 comprising silicon nitride of 50 nm thickness formed with a plasma CVD method and a second interlayer dielectric film 301 comprising silicon oxide of 1.5 μm thickness formed with a plasma CVD method successively, a first opening 550 was formed to a second interlayer dielectric film 301 in a region for forming the MIM capacitor by using a trench-first dual damascene method. In this case, etching was controlled such that the surface of the fifth metal interconnect 70 is not exposed in the inside of the first opening 500 and the barrier dielectric film 406 is left at the bottom of the opening. In this case, the planar shape of the first opening 500 was of a square shaped 1.4 μm side length (FIG. 22A).

Figure 22B:
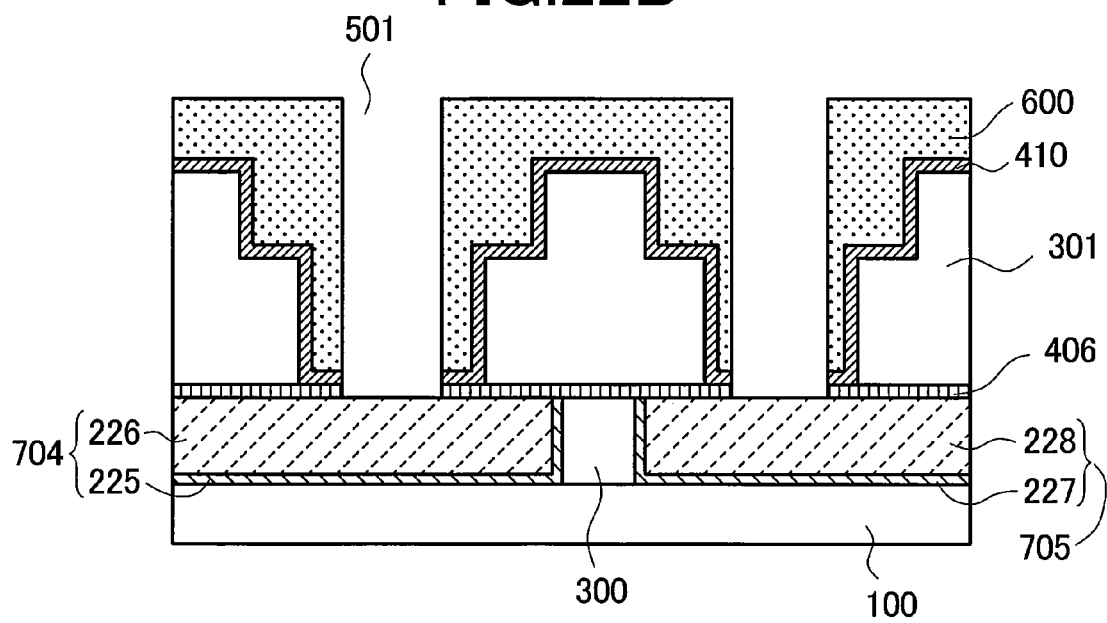
FIG. 22B is a cross sectional schematic view for a main portion of a manufacturing step of a semiconductor device according to the eighth embodiment of the present invention.

Then, after forming a second spacer film 410 comprising silicon carbide of 50 nm film thickness over the entire surface by a plasma CVD method, a first fabrication resist 600 comprising a photosensitive organic polymer film was formed on the second spacer film. The first fabrication resist 600 has an opening at least above a region intended to form the MIM capacitor. Then, the second spacer film 410 and the barrier dielectric film 406 were etched so as to expose the surface of the fifth metal interconnect 704 by using the first fabrication resist 600 as a fabrication mask to form a second opening 501. The second opening 501 formed to the second spacer film 410 and the barrier dielectric film 406 is formed such that the planar shape was a square shape of 1 μm side length and it was completely included in the inside of the first opening 500. Accordingly, a step due to the second spacer film 410 and the barrier dielectric film 406 is formed in the inside of the opening 500, and a step of 100 nm corresponding to the total thickness for the second spacer film 410 and the barrier electric film 406 is formed on the upper surface of the fifth metal interconnect 704. The step formed therein corresponds to the height of the step in the first embodiment (FIG. 22B).

Then, after removing the first fabrication resist 600, hafnium oxide of 15 nm film thickness formed by an ALD method and titanium nitride of 50 nm film thickness formed by a CVD method, were formed, and a second fabrication resist 601 comprising a photosensitive organic polymer film was formed so as to cover a region intended to serve as a capacitor by using a lithographic method. Then, an unnecessary portion of hafnium oxide and titanium nitride was removed by using the second fabrication resist 601 as an etching mask, and a fabricated upper electrode 215 comprising titanium nitride of 50 nm film thickness and a fabricated capacitance film 405 comprising hafnium oxide of 15 nm film thickness were formed (FIG. 23A).

Then, after removing the second fabrication resist 601 and then forming tantalum of 50 nm film thickness and a copper film of 100 nm thickness by a sputtering method and after growing the copper film further by an electroplating method, excess tantalum film and copper film above the second interlayer dielectric film 301 were removed by using a chemical-mechanical polishing method, and a seventh metal interconnect 706 comprising a third adhesive layer 229 comprising tantalum of 50 nm film thickness and a third copper layer 230 comprising a copper film of 450 nm thickness, and an eighth metal interconnect 707 comprising a fourth adhesive layer 231 comprising tantalum of 50 nm film thickness and a fourth copper layer 232 comprising a copper film of 50 nm thickness were formed. As described above, it is possible to form a semiconductor device having an MIM capacitor comprising the fifth metal interconnect 704, the fabricated capacitance film 405, the fabricated upper electrode 215, and a seventh metal interconnect 706. In the eighth embodiment, a planar layout as shown in the third embodiment is not illustrated but this is basically according to the layout shown in FIG. 13. However, the sizes of the first opening 755 and the second opening 756 are different from those in the present embodiment.

As a result of examining the performance and the reliability of the MIM capacitor in the semiconductor device having the thus formed MIM capacitor, capacitance density, breakdown field strength and leakage current substantially same as those shown in the first embodiment were obtained and substantially the same effect was obtained also for the variation of each of the performances.

That is, it is possible to form a semiconductor device having an MIM capacitor capable of making high capacitance density and high capacitance accuracy compatible while having a high reliability in accordance with the embodiment of the invention, by forming an interlayer dielectric film comprising silicon oxide so as to cover the fifth metal interconnect, then forming the first opening to the interlayer dielectric film above the fifth metal interconnect in a region corresponding to the via hole layer in the interlayer dielectric film just above the fifth metal interconnect, then forming the second spacer film so as to cover the first opening, forming a second opening to the second spacer film so as to be included in the first opening and expose the surface of the fifth metal interconnect, then forming the capacitance film, the second metal interconnect, thereby forming the MIM capacitor comprising the fifth metal interconnect, the capacitance film and the seventh metal interconnect.

In this embodiment, different from the third embodiment, after removing the interlayer dielectric film for the MIM capacitor portion to form the first opening, the second spacer film having the second opening is formed. Since the height of the step can be controlled by the thickness of the second spacer film, it has a merit capable of easily improving the controllability for the height of the step compared with the first embodiment. However, since the size for the first opening formed in the interlayer dielectric film decreases in accordance with the thickness of the second spacer film, the resistance increases more compared with the method of the first embodiment.

In this embodiment, since the thickness of the spacer film is 50 nm and that of the barrier dielectric film is 50 nm, the height of the step is 100 nm, but the height for the step can be changed optionally. With the reasons described for the first embodiment, the height for the step is preferably within a range from 50 nm to 300 nm, the total film thickness is preferably within the range described above. The thickness of the barrier dielectric film is defined by the barrier property of the barrier dielectric film and the etching selectivity upon forming the first opening 500. In this case, upon forming the first opening 500, it is desirable to control the etching so as not to expose the surface of the fifth metal interconnect 704 in view of the reliability. Further, while the second spacer film and the barrier dielectric film were formed of different materials in this embodiment, they may be formed of an identical material.

Further, while the first opening and the second opening are laid out such that the centers thereof are aligned and the edge of the first opening is laid out at a position apart by 200 nm from the edge of the second opening, the layout can be changed optionally. With the reason as described for the first embodiment, it is desirable to narrow the edge gap within a range of the aligning margin in the lithographic step and it is not always necessary that the centers for the respective openings are aligned. Further, in this embodiment, while silicon carbide formed by using the plasma CVD method was used as the spacer film, the film deposition method and the material are not restrictive. As other materials, dielectric materials such as silicon nitride, aluminum oxide, aluminum nitride, boron nitride, and Low-k material can also be used.

Further, while the planar shape for the first opening and the second opening is made square, the usefulness of this embodiment is not restricted thereto. In addition to the square shape, a rectangular shape, a circular shape, an elliptic shape, a trigonal shape, a rhombic shape, or a combined shape may also be used.

Further, in this embodiment, while only one second opening is formed in the first opening, a plurality of openings may be formed optionally.

Further, in this embodiment, while the MIM capacitor region and the via hole region used as the interconnect are opened simultaneously, they can be formed separately by using the step shown in the fourth embodiment.

In this embodiment, while hafnium oxide of 15 nm film thickness was used for the capacitance film, the film thickness and the material are not restricted to them. Further, as the material for the capacitance film, in addition to the hafnium oxide, silicon oxide, silicon nitride, tantalum oxide, zirconium oxide, lanthanum oxide, titanium oxide, or aluminum oxide, as well as a mixture thereof and a compounds incorporated with nitrogen to them can also be used. Further, a ferrodielectric material such as PZT, STO, and BST can also be used. Further, the capacitance film may be optionally in a stacked structure.

Further, in this embodiment, while titanium nitride of 50 nm film thickness formed by the CVD method is used for formation of the upper electrode, other film thicknesses, materials and film deposition methods than those described above can also be used. As other materials than titanium nitride, metals including tungsten, molybdenum, tantalum, and nitrides thereof as the main component can also be used.

Further, while the fifth, sixth, seventh, and eighth metal interconnects are formed by the combination of tantalum and copper, other materials may also be used. In addition to tantalum, those metals comprising titanium, tungsten, molybdenum, and nitrides thereof as the main component can also be used and a metal layer in a stacked structure can also be used optionally. Further, aluminum, tungsten, titanium, and alloys and compounds thereof can also be used instead of the copper film.

Further, in this embodiment, while the capacitance film was formed directly to the surface of the fifth metal interconnect, the surface of the copper film may optionally be covered with other conductor materials. For example, the metal can be grown selectively only on the surface of the copper film exposed to the surface of the fifth metal interconnect by using a selective CVD method or an electroless plating method. By using the method, a sufficient reliability can be maintained also in a case of using a capacitance film material in which copper is diffused easily.

Further, while the trench-first dual damascene method was used as the fabrication method for the seventh and the eighth metal interconnects in this embodiment, the effectiveness of the method is not restricted to them. The same effect can also be expected by other dual damascene methods and a single damascene method of forming the interconnect trench and the via hole independently. In a case of the single damascene method, it is effective to apply the embodiment to the via hole forming process.

Further, while description has been made in this embodiment to a step of using the silicon oxide film mainly as the first and the second interlayer dielectric films as an example, the film is not restricted to the material but it is also possible to use a Low-k material capable of decreasing the coupling capacitance of the interconnect. As the Low-k material, an SiOC film, organic polymer film, or Low-k material introducing pores to them, fluorine-containing silicon oxide film, etc can also be used.

References used in the drawings of the present application are as shown below.

100 . . . substrate formed with semiconductor device
200 . . . lower electrode
201 . . . upper electrode
202 . . . first lower electrode
203 . . . second lower electrode
204 . . . first upper electrode
205 . . . second upper electrode
206 . . . metal interconnect connected with first conductive plug
207 . . . metal interconnect connected with second conductive plug
208 . . . first barrier metal
209 . . . first aluminum layer
210 . . . second barrier metal
211 . . . third barrier metal
212 . . . second aluminum layer
213 . . . fourth barrier metal layer
214 . . . upper electrode film
215 . . . fabricated upper electrode
216 . . . first barrier metal film
217 . . . first aluminum film
218 . . . second barrier metal film
219 . . . fifth barrier metal layer
220 . . . third aluminum layer
221 . . . sixth barrier metal layer
222 . . . seventh barrier metal layer
223 . . . fourth aluminum layer
224 . . . eighth barrier metal layer
225 . . . first adhesive layer
226 . . . first copper layer
227 . . . second adhesive layer
228 . . . second copper layer
229 . . . third adhesive layer
230 . . . third copper layer
231 . . . fourth adhesive layer
232 . . . fourth copper layer
233 . . . fifth adhesive layer
234 . . . fifth copper layer
250 . . . conductive plug
251 . . . first conductive plug
252 . . . second conductive plug
300 . . . first interlayer dielectric film
301 . . . second interlayer dielectric film
302 . . . third interlayer dielectric film
400 . . . first capacitance film
401 . . . fabricated first capacitance film
402 . . . fabricated second capacitance film
403 . . . fabricated third capacitance film
404 . . . capacitance film
405 . . . fabricated capacitance film
406 . . . barrier dielectric film
407 . . . etch stop layer
408 . . . second etch stop layer
409 . . . spacer dielectric film
410 . . . second spacer dielectric film
500 . . . first opening
501 . . . second opening
502 . . . third opening
503 . . . fourth opening 600 ... first fabrication resist
601 ... second fabrication resist
602 ... third fabrication resist
603 ... fourth fabrication resist
700 ... first metal interconnect
701 ... second metal interconnect
702 ... third metal interconnect
703 ... fourth metal interconnect
704 ... fifth metal interconnect
705 ... sixth metal interconnect
706 ... seventh metal interconnect
707 ... eighth metal interconnect
750 ... first metal interconnect
751 ... second metal interconnect
752 ... third metal interconnect
753 ... fourth metal interconnect
754 ... capacitance film of MIM capacitor
755 ... first opening
756 ... second opening
757 ... third opening
458 ... fourth opening
759 ... fifth metal interconnect
760 ... sixth metal interconnect
761 ... seventh metal interconnect
762 ... eighth metal interconnect

What is claimed is:

1. A method of manufacturing a semiconductor device, the method comprising:
    forming a first metal interconnect layer on a semiconductor substrate;
    forming an interlayer dielectric film on the first metal interconnected layer;
    forming an opening in a desired region of the interlayer dielectric film;
    forming a capacitance dielectric film in the opening so as to be in contact with the first metal interconnect layer; and
    forming a second metal interconnect layer in the opening and on the interlayer dielectric film, wherein
    the opening is formed in a region intended to form capacitance of the interlayer dielectric film placed on the first metal interconnect layer by performing a lithography process at least twice; and
    one of the two lithography processes is performed on the interlayer dielectric film remaining on the first metal interconnect layer with a thickness less than that of the interlayer dielectric film that is disposed between an upper surface of the first metal interconnect layer and a bottom of the second metal interconnect layer formed on the interlayer dielectric film at a periphery of the opening.

2. The method of manufacturing a semiconductor device according to claim 1, wherein
    the opening includes at least two types of a first opening and a second opening which have different planar shapes from each other;
    the second opening is formed above the first metal interconnect layer; and
    the first opening is formed above the second opening so that the upper end of the second opening and the bottom of the first opening are in contact with each other and that the second opening is formed inside the first opening.

3. The method of manufacturing a semiconductor device according to claim 2, wherein
    a distance between the first metal interconnect layer and the first opening is shorter than a distance between the upper surface of the first metal interconnect layer and the bottom of the second metal interconnect layer formed on the interlayer dielectric film.

4. A method of manufacturing a semiconductor device, the method comprising:
    forming a first metal interconnect layer on a semiconductor substrate;
    forming an interlayer dielectric film on the first metal interconnected layer;
    forming an opening in the interlayer dielectric film; and
    forming a capacitance dielectric film in the opening so as to be in contact with the first metal interconnect layer and forming a second metal interconnect layer, wherein
    forming the opening includes forming a first opening by perforating a desired region in the interlayer dielectric film placed on the first metal interconnect layer from a surface of the interlayer dielectric film at a first thickness so as not to expose the first metal interconnect layer, and forming a second opening by perforating an inside of the first opening at a second thickness so as to reach the first metal interconnect layer; and
    the second thickness is less than the first thickness.

5. The method of manufacturing a semiconductor device according to claim 4, wherein
    at least two kinds of openings different in planar shape from each other are overlapped in a vertical direction of the openings;
    the second opening is formed on the first metal interconnect layer; and
    the first opening is formed so as to be placed above the second opening and so that the second opening is formed inside the first opening.

6. The method of manufacturing a semiconductor device according to claim 4, wherein
    the second thickness is less than the thickness of the interlayer dielectric film which is between the upper surface of the first metal interconnect layer and the bottom of the second metal interconnect layer formed on the interlayer dielectric film at the periphery of the opening.

7. The method of manufacturing a semiconductor device according to claim 4, wherein
    the second thickness is 50 nm or more and 300 nm or less.

8. The method of manufacturing a semiconductor device according to claim 1, wherein
    the capacitance dielectric film comprises, as a main component, a dielectric film selected from silicon oxide, silicon nitride, tantalum oxide, hafnium oxide, zirconium oxide, lanthanum oxide, titanium oxide, aluminum oxide, PZT, STO, and BST.

9. The method of manufacturing a semiconductor device according to claim 1, wherein
    the first metal interconnect layer and the second metal interconnect layer comprise, as a main component, a metal selected from tungsten, titanium, tantalum, tungsten, molybdenum, and a nitride thereof, or copper or aluminum and alloys thereof.

* * * * *